US012787774B2

(12) United States Patent
Yoshihara

(10) Patent No.: US 12,787,774 B2
(45) Date of Patent: Nov. 3, 2026

(54) SEMICONDUCTOR DEVICE

(71) Applicant: ROHM CO., LTD., Kyoto (JP)

(72) Inventor: Katsuhiko Yoshihara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 334 days.

(21) Appl. No.: 18/667,009

(22) Filed: May 17, 2024

(65) Prior Publication Data

US 2024/0304589 A1 Sep. 12, 2024

Related U.S. Application Data

(63) Continuation of application No. PCT/JP2022/046162, filed on Dec. 15, 2022.

(30) Foreign Application Priority Data

Dec. 21, 2021 (JP) ................................ 2021-207018

(51) Int. Cl.

*H10W 40/25* (2026.01)
*H10W 72/00* (2026.01)
*H10W 90/00* (2026.01)

(52) U.S. Cl.

CPC ........ *H10W 40/258* (2026.01); *H10W 72/884* (2026.01); *H10W 90/736* (2026.01); *H10W 90/756* (2026.01)

(58) Field of Classification Search

CPC ............. H10W 40/258; H10W 72/884; H10W 90/736; H10W 90/756; H10W 72/851; H10W 40/255; H10W 72/071; H10W 72/075; H10W 72/30; H10W 72/50; H10D 12/00; H10D 30/60

See application file for complete search history.

(56) References Cited

U.S. PATENT DOCUMENTS

2021/0384097 A1* 12/2021 Wu ...................... H10W 40/10

FOREIGN PATENT DOCUMENTS

WO 2020/012958 A1 1/2020

OTHER PUBLICATIONS

International Search Report and Written Opinion mailed on Mar. 14, 2023, received for PCT Application PCT/JP2022/046162, filed on Dec. 15, 2022, 8 pages including English Translation.

* cited by examiner

*Primary Examiner* — Mohammad A Rahman
(74) *Attorney, Agent, or Firm* — XSENSUS LLP

(57) ABSTRACT

A semiconductor device includes a support member, semiconductor element, buffer layer and conductive member. The semiconductor element includes first and gate electrodes opposite from the side facing the support member in first direction. The semiconductor element is bonded to the support member. The buffer layer is electrically bonded to the first electrode. The conductive member is electrically bonded to the buffer layer. A first solid phase diffusion binding layer is between the first electrode and the buffer layer. The semiconductor element includes, on the same side as the gate electrode in first direction, a gate finger connected to the gate electrode. The gate finger includes a protrusion beyond the first electrode toward the buffer layer. The buffer layer includes a recess recessed from the side facing the semiconductor element in first direction. At least a part of the protrusion is accommodated in the recess.

17 Claims, 18 Drawing Sheets

SEMICONDUCTOR DEVICE

CROSS-REFERENCE TO RELATED APPLICATIONS

This application is a continuation application of International Application No. PCT/JP2022/046162, filed Dec. 15, 2022, which claims priority to Japanese Patent Application No. 2021-207018, filed Dec. 21, 2021. The contents of these applications are incorporated herein by reference in their entirety.

TECHNICAL FIELD

The present disclosure relates to a semiconductor device.

BACKGROUND ART

A semiconductor device provided with a semiconductor element (such as a MOSFET) having a switching function has been conventionally known. The semiconductor device is mainly used for power conversion. WO 2020/012958 A1 discloses an example of the semiconductor device. The semiconductor device disclosed in the document includes a semiconductor element having an obverse-surface electrode corresponding to a source electrode. The obverse-surface electrode has a first portion and a plurality of second portions formed in bumps with respect to the first portion. Each of the second portions has a copper wire (i.e., a wire containing copper in its composition) electrically bonded thereto. As compared to a gold wire, a copper wire gives a large impact on a semiconductor element to which the wire is electrically bonded. In the semiconductor device disclosed in WO 2020/012958 A1, the second portions function as a mitigation layer that reduces the impact on the semiconductor element.

In a case where a mitigation layer is provided for an electrode of a semiconductor element (a source electrode if the semiconductor element is a MOSFET) having a switching function as in the semiconductor device disclosed in WO 2020/012958 A1, the mitigation layer may be electrically bonded to the electrode by solid phase diffusion. This makes it possible to reduce thermal resistance and electric resistance at the interface between the electrode and the mitigation layer. However, when the mitigation layer is electrically bonded to the electrode by solid phase diffusion, the mitigation layer may interfere with a gate finger, depending on the configuration of the semiconductor element. This may be caused as a result of the gate finger including a protrusion that protrudes beyond the electrode of the semiconductor element toward the mitigation layer. In this case, the mitigation layer is subjected to pressure associated with solid phase diffusion. Thus, a larger impact is transmitted from the mitigation layer to the semiconductor element via the gate finger, which may cause a crack in the semiconductor element.

DETAILED DESCRIPTION OF EMBODIMENTS

Figure 1:
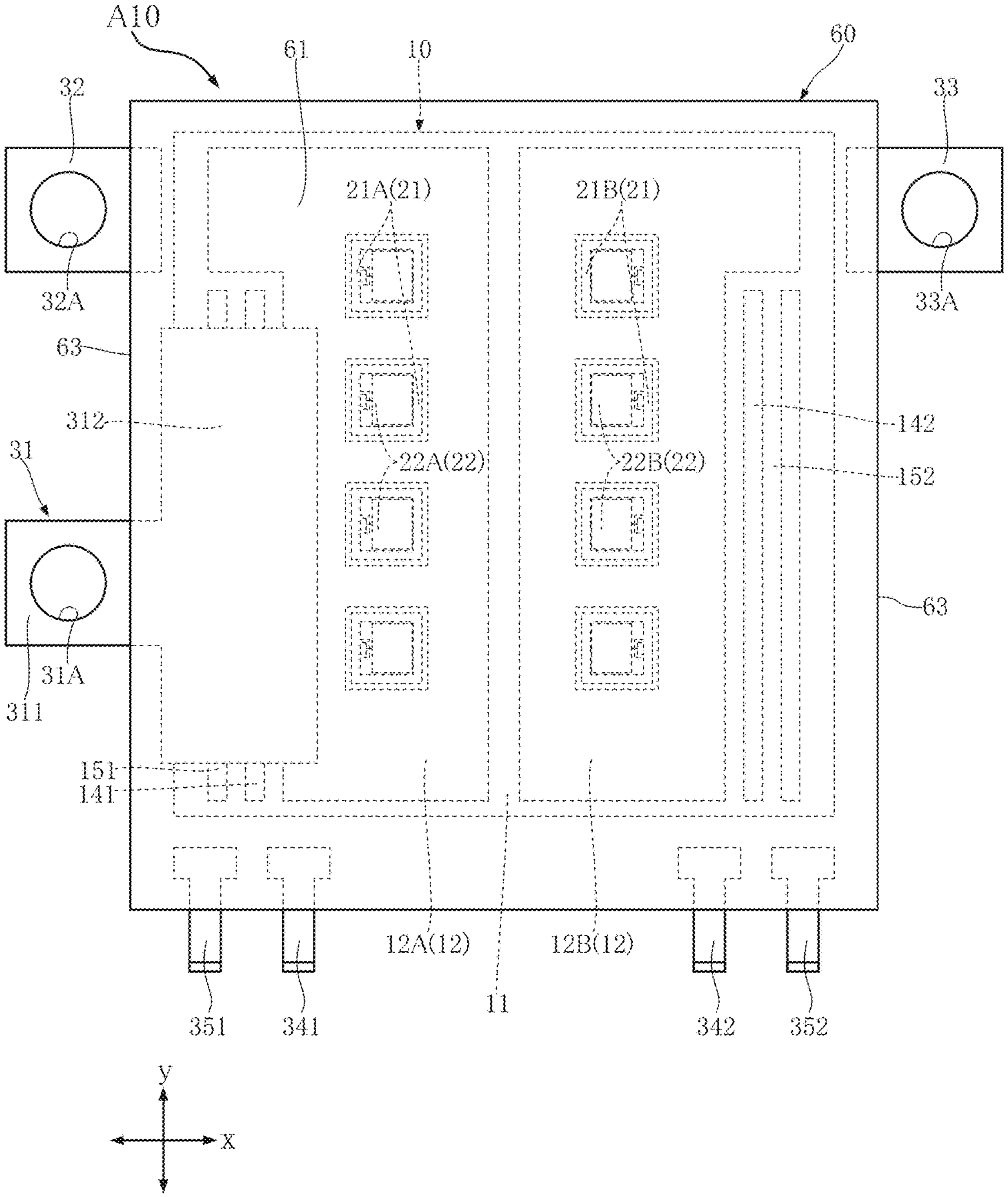
FIG. 1 is a plan view showing a semiconductor device according to a first embodiment of the present disclosure.

Embodiments of the present disclosure will be described below with reference to the accompanying drawings.

First Embodiment

The following describes a semiconductor device A10 according to a first embodiment of the present disclosure, with reference to FIGS. 1 to 14. The semiconductor device A10 includes a support member 10, a plurality of semiconductor elements 21, a plurality of buffer layers 22, a bonding layer 28, a first terminal 31, a second terminal 32, a third terminal 33, a plurality of first conductive members 41, a plurality of second conductive members 42, a third conductive member 43, a fourth conductive member 44, and a sealing resin 60.

Figure 2:
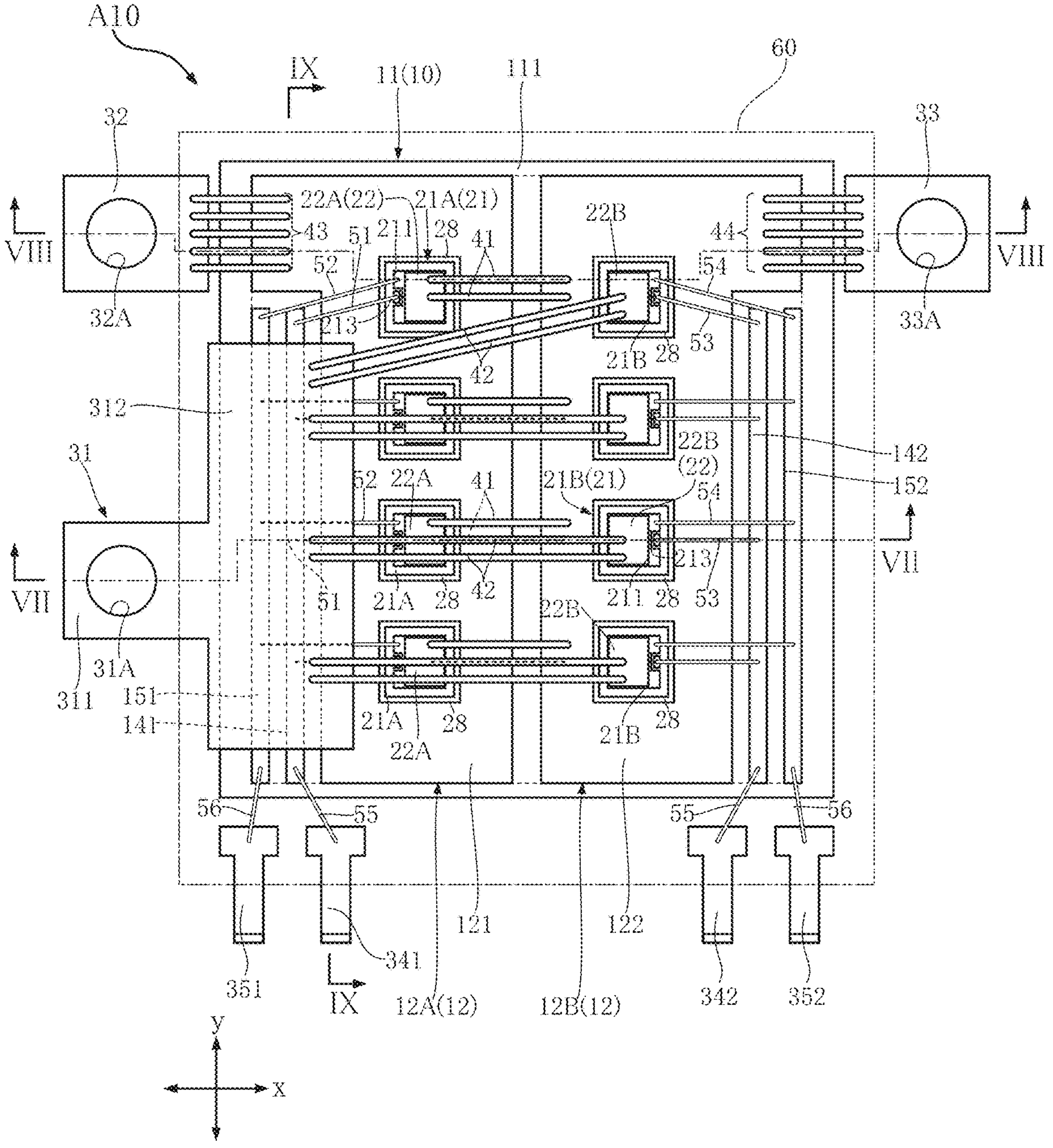
FIG. 2 is a plan view corresponding to FIG. 1, with a sealing resin shown as transparent.
Figure 3:
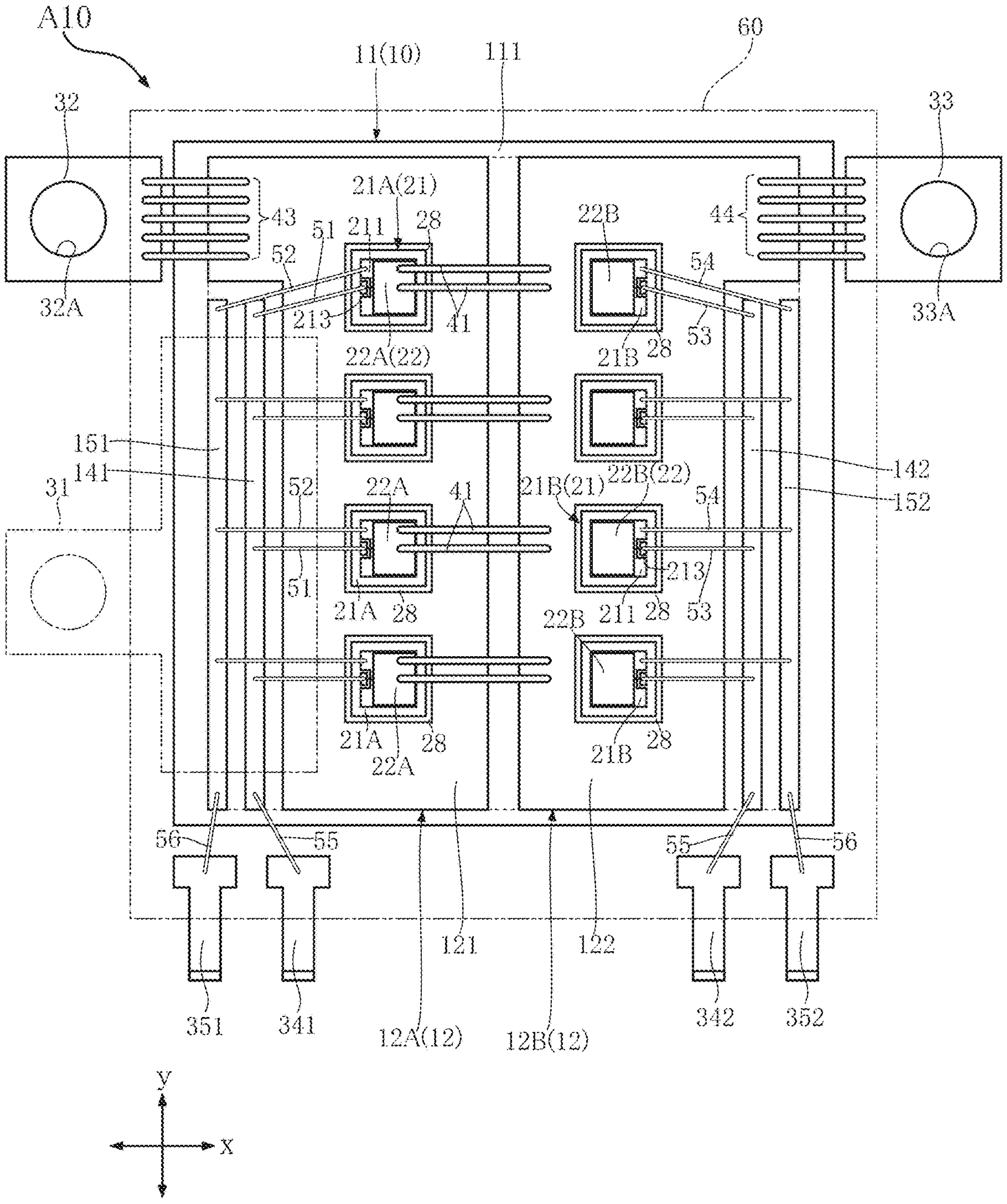
FIG. 3 is a plan view corresponding to FIG. 2, where a first terminal is shown as transparent and a second conductive member is omitted.

The semiconductor device A10 further includes a first gate wiring layer 141, a second gate wiring layer 142, a first detection wiring layer 151, a second detection wiring layer 152, a first gate terminal 341, a second gate terminal 342, a first detection terminal 351, and a second detection terminal 352. For convenience of understanding, FIG. 2 shows the sealing resin 60 as transparent. FIG. 3 corresponds to FIG. 2, but shows the first terminal 31 as transparent and omits the second conductive members 42 to facilitate understanding. FIGS. 2 and 3 show the sealing resin 60 as transparent, and the outline of the sealing resin 60 is indicated by an imaginary line (two-dot chain line). FIG. 3 shows the first terminal 31 as transparent, and the outline of the first terminal 31 is indicated by an imaginary line. FIG. 2 shows line VII-VII and line VIII-VIII with single-dot chain lines.

In the description of the semiconductor device A10, the normal direction of a first obverse surface 121 of a first conductive layer 12A, which will be described below, is referred to as a "first direction z" for convenience. A direction perpendicular to the first direction z is referred to as a "second direction x". The direction perpendicular to the first direction z and the second direction x is referred to as a "third direction y".

The semiconductor device A10 uses the semiconductor elements 21 to convert the DC source voltage applied to the first terminal 31 and the second terminal 32 into AC power. The AC power obtained by the conversion is inputted from the third terminal 33 to a power-supply target such as a motor. The semiconductor device A10 forms a part of a power conversion circuit such as an inverter.

Figure 7:
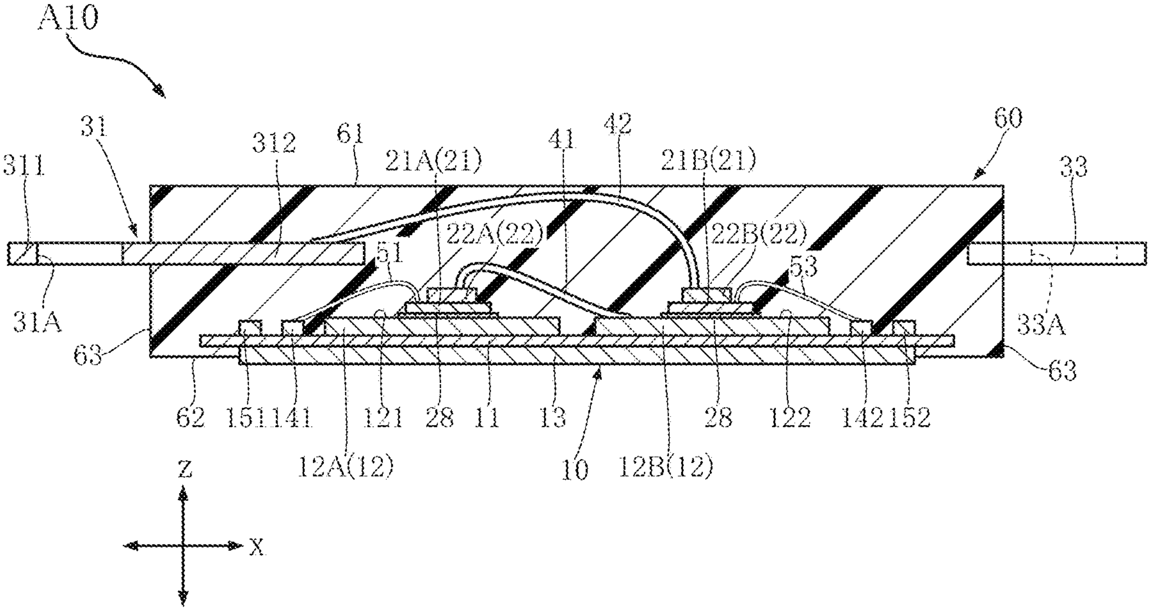
FIG. 7 is a cross-sectional view along line VII-VII in FIG. 2.
Figure 8:
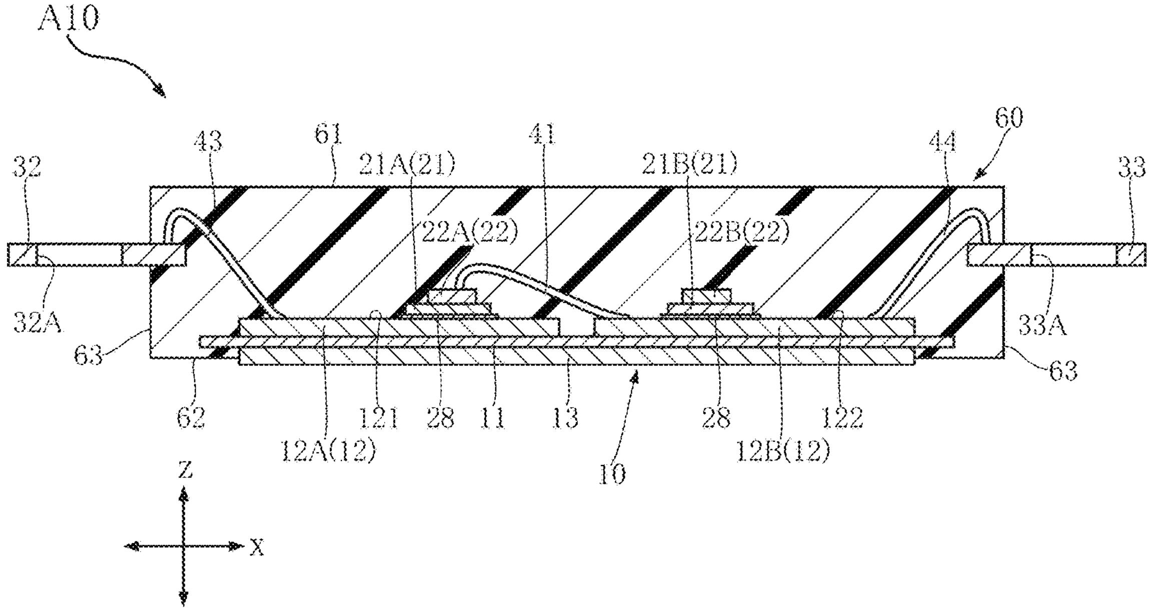
FIG. 8 is a cross-sectional view along line VIII-VIII in FIG. 2.

The support member 10 has the semiconductor elements 21 bonded thereto, and supports the first gate wiring layer 141, the second gate wiring layer 142, the first detection wiring layer 151, the second detection wiring layer 152, and the sealing resin 60. As shown in FIGS. 7 and 8, the support member 10 includes an insulating layer 11, two conductive layers 12, and a heat dissipation layer 13.

Figure 4:
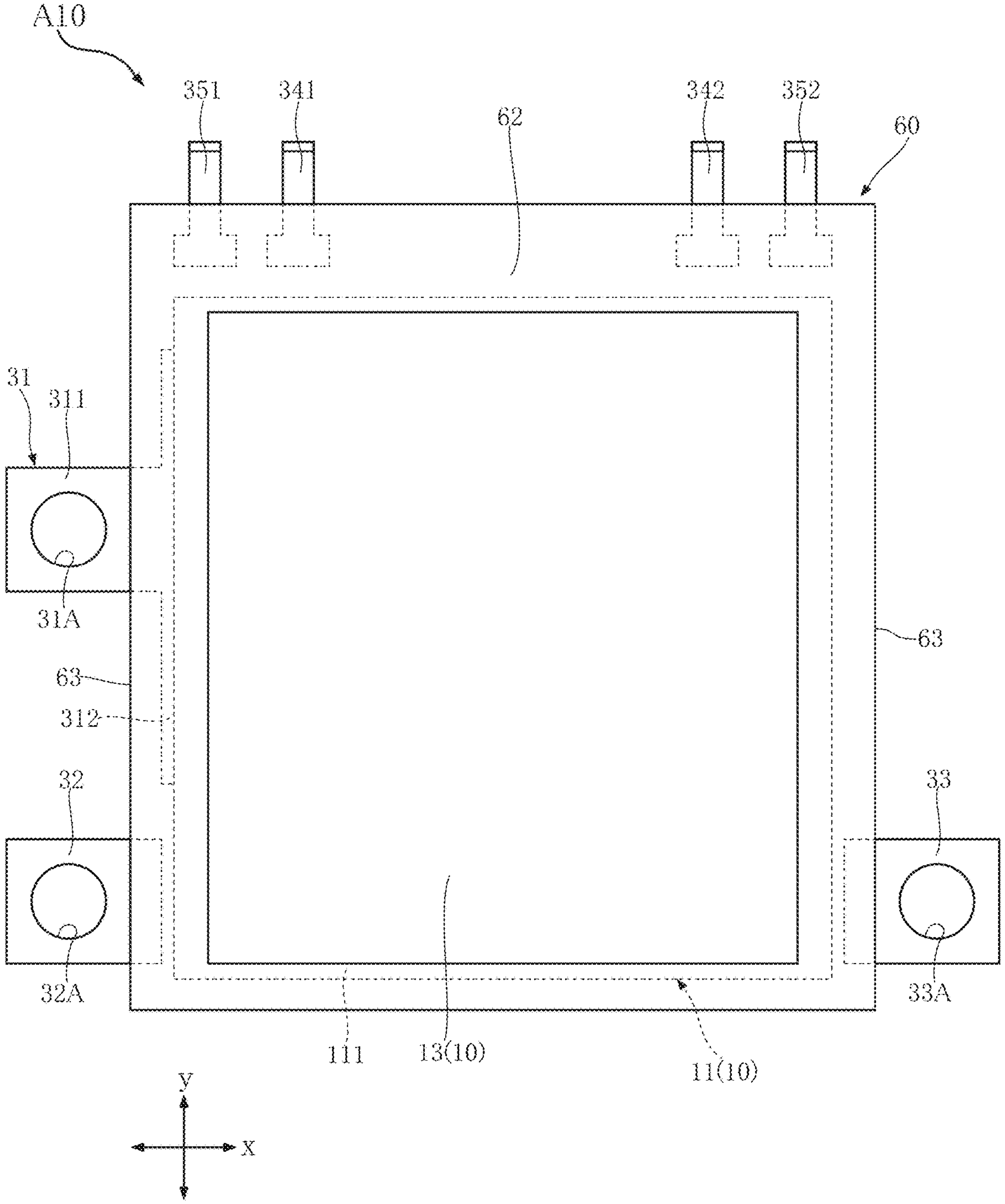
FIG. 4 is a bottom view showing the semiconductor device in FIG. 1.

As shown in FIG. 7, the insulating layer 11 supports the two conductive layers 12, the first gate wiring layer 141, the second gate wiring layer 142, the first detection wiring layer 151, the second detection wiring layer 152, the heat dissipation layer 13, and the sealing resin 60. The insulating layer 11 is electrically insulative. The insulating layer 11 is made of a material containing a ceramic, for example. It is preferable that the ceramic have higher thermal conductivity. Such ceramic may be aluminum nitride (AlN), for example. It is preferable that the material of the insulating layer 11 have relatively high thermal conductivity. As shown in FIGS. 3 and 4, the insulating layer 11 has a periphery 111 as viewed in the first direction z. The periphery 111 forms the outline of the insulating layer 11.

As shown in FIGS. 7 and 8, the two conductive layers 12 are located between the insulating layer 11 and the semiconductor elements 21 in the first direction z. The two conductive layers 12 are bonded to the insulating layer 11. As viewed in the first direction z, the two conductive layers 12 are surrounded by the periphery 111 of the insulating layer 11. The composition of the two conductive layers 12 includes copper (Cu). In other words, the conductive layers 12 contain copper. The two conductive layers 12 include a first conductive layer 12A and a second conductive layer 12B spaced apart from each other in the second direction x.

As shown in FIG. 3, a part of the first conductive layer 12A is cut out in a rectangular shape elongated in the third direction y. The cutout part of the first conductive layer 12A is located opposite from the side facing the second conductive layer 12B in the second direction x. The first conductive layer 12A has a first obverse surface 121. The first obverse surface 121 faces opposite from the side facing the insulating layer 11 in the first direction z.

As shown in FIG. 3, a part of the second conductive layer 12B is cut out in a rectangular shape elongated in the third direction y. The cutout part of the second conductive layer 12B is located opposite from the side facing the first conductive layer 12A in the second direction x. The second conductive layer 12B has a second obverse surface 122. The second obverse surface 122 faces opposite from the side facing the insulating layer 11 in the first direction z.

Figure 9:
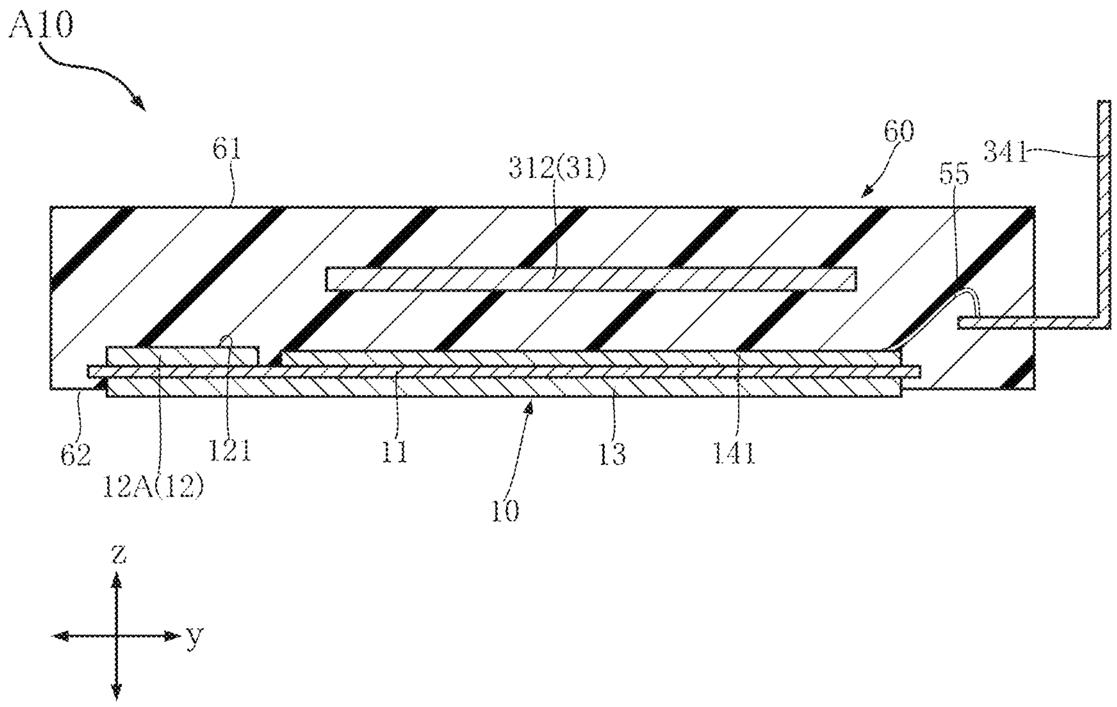
FIG. 9 is a cross-sectional view along line IX-IX in FIG. 2.

As shown in FIGS. 7 to 9, the heat dissipation layer 13 is located opposite from the two conductive layers 12 with respect to the insulating layer 11 in the first direction z. The heat dissipation layer 13 is bonded to the insulating layer 11. As viewed in the first direction z, the heat dissipation layer 13 is surrounded by the periphery 111 of the insulating layer 11. The composition of the heat dissipation layer 13 includes copper. As viewed in the first direction z, the area of the heat dissipation layer 13 is larger than the sum of the area of the first conductive layer 12A and the area of the second conductive layer 12B. The heat dissipation layer 13 is exposed to the outside from the sealing resin 60.

As shown in FIGS. 7 and 8, the thickness of each of the two conductive layers 12 and the heat dissipation layer 13 is larger than the thickness of the insulating layer 11.

Figure 10:
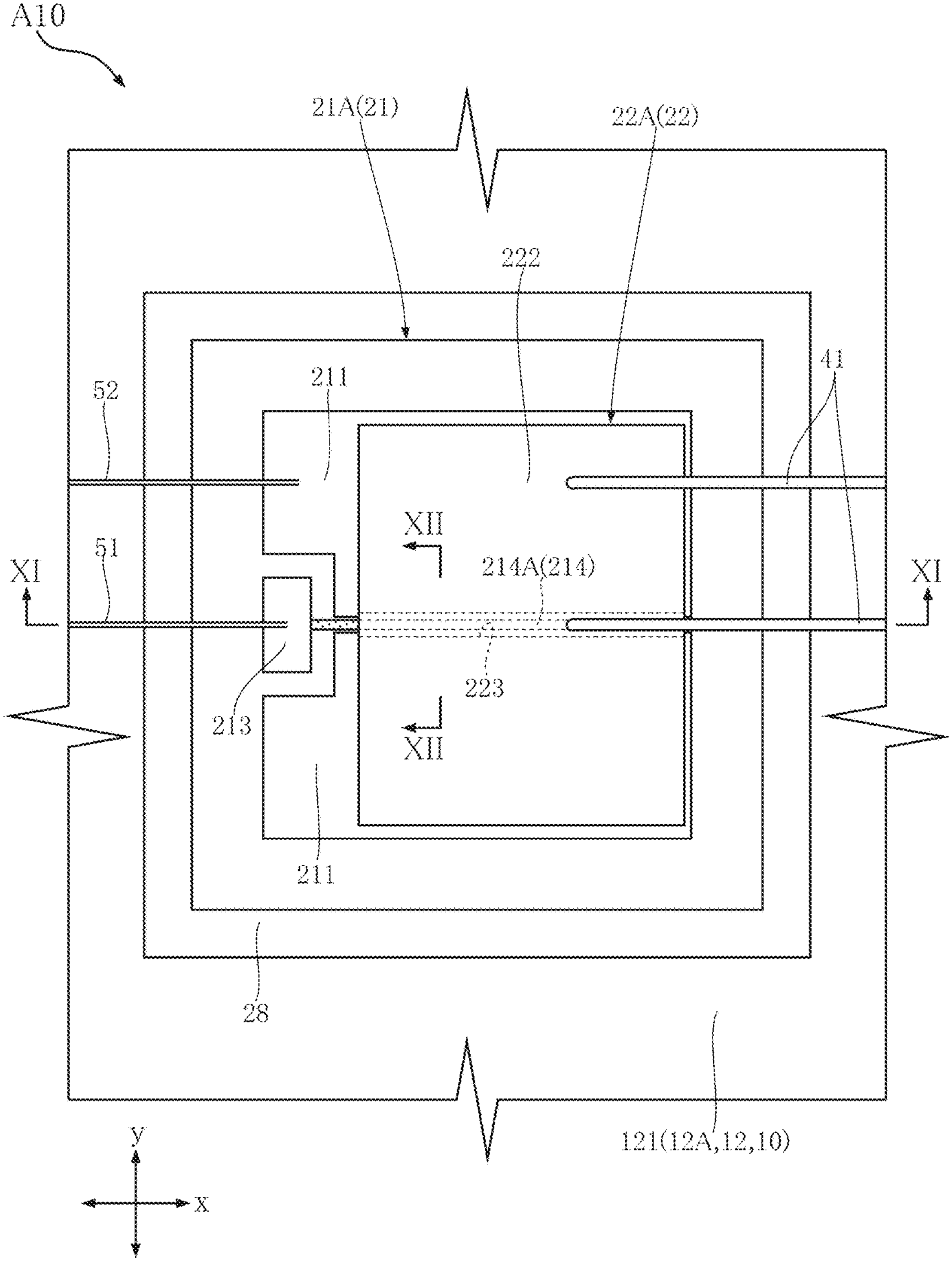
FIG. 10 is a partially enlarged view of FIG. 2.
Figure 11:
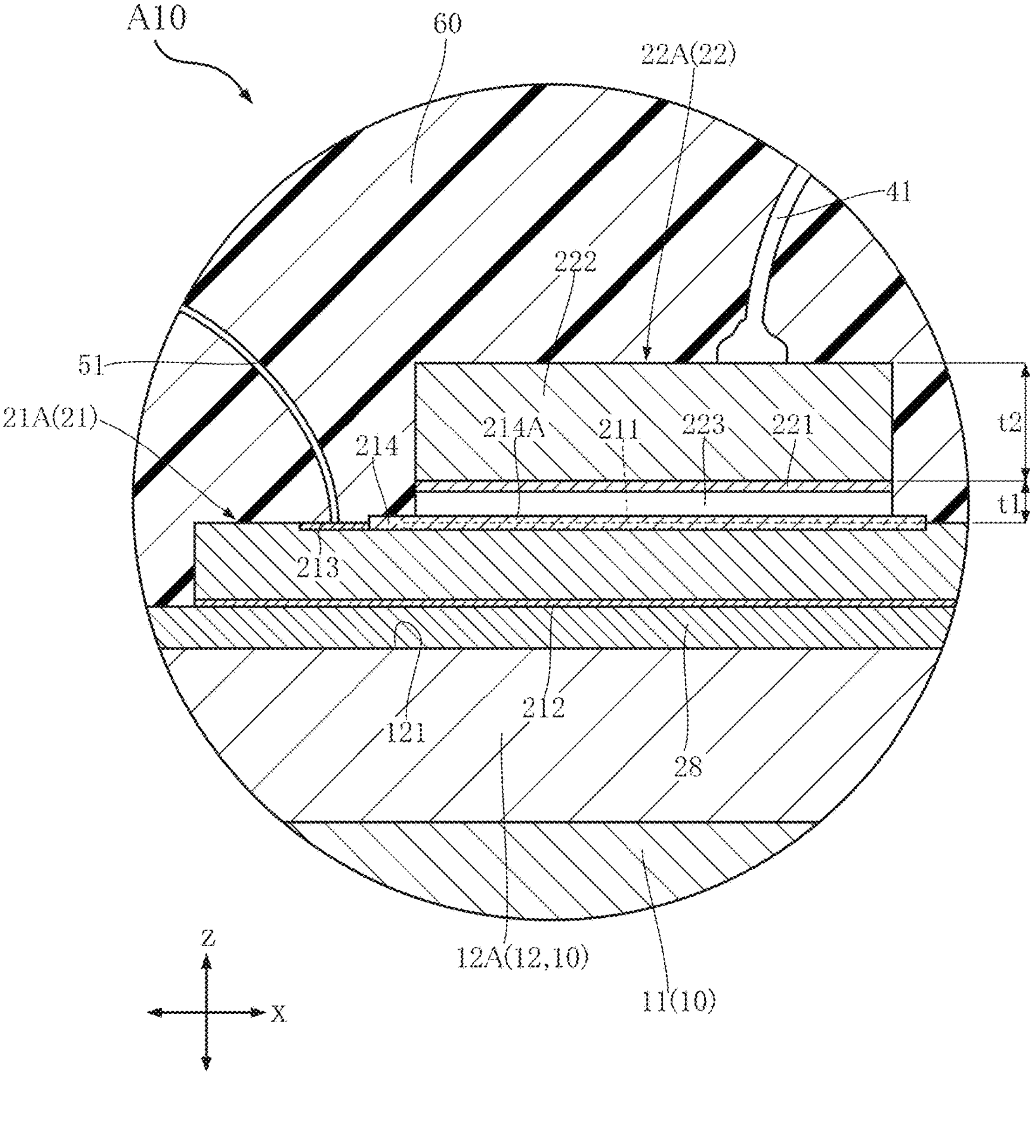
FIG. 11 is a cross-sectional view along line XI-XI in FIG. 10.

As shown in FIGS. 2, 3, 7, and 8, the semiconductor elements 21 are bonded to the two conductive layers 12. In the semiconductor device A10, the semiconductor elements 21 include four first elements 21A and four second elements 21B. The four first elements 21A are bonded to the first obverse surface 121 of the first conductive layer 12A. The four second elements 21B are bonded to the second obverse surface 122 of the second conductive layer 12B. The semiconductor elements 21 are metal-oxide-semiconductor field-effect transistors (MOSFETs), for example. Alternatively, the semiconductor elements 21 may be switching elements such as insulated gate bipolar transistors (IGBTs). In the description of the semiconductor device A10, each of the semiconductor elements 21 is an n-channel type MOSFET with a vertical structure. Each of the semiconductor elements 21 includes a compound semiconductor substrate. The composition of the compound semiconductor substrate includes silicon carbide (SiC). As shown in FIGS. 10 and 11, each of the semiconductor elements 21 has a first electrode 211, a second electrode 212, a gate electrode 213, and a gate finger 214.

As shown in FIGS. 10 and 11, the first electrode 211 is located opposite from the side facing one of the two conductive layers 12 in the first direction z. The current flowing through the first electrode 211 corresponds to the electric power that has been converted by the semiconductor element 21. In other words, the first electrode 211 corresponds to the source electrode of the semiconductor element 21.

As shown in FIG. 11, the second electrode 212 faces one of the two conductive layers 12. The current flowing through the second electrode 212 corresponds to the electric power that has yet to be converted by the semiconductor element 21. In other words, the second electrode 212 corresponds to the drain electrode of the semiconductor element 21.

As shown in FIGS. 10 and 11, the gate electrode 213 is located opposite from the side facing one of the two conductive layers 12 in the first direction z. Thus, the gate electrode 213 is positioned on the same side as the first electrode 211 in the first direction z. A gate voltage for driving the semiconductor element 21 is applied to the gate electrode 213. As viewed in the first direction z, the area of the gate electrode 213 is smaller than the area of the first electrode 211.

As shown in FIGS. 10 and 11, the gate finger 214 is positioned on the same side as the gate electrode 213 in the first direction z. The gate finger 214 is connected to the gate electrode 213. In the semiconductor device A10, the gate finger 214 extends from the gate electrode 213 in the second direction x. The gate finger 214 divides the first electrode 211 into two portions. The gate finger 214 electrically connects the gate electrode 213 to a plurality of trench gates configured within the semiconductor element 21 (when the semiconductor element 21 is a trench-gate type MOSFET). The gate finger 214 may contain polysilicon and polyimide covering the polysilicon. As a result, the gate finger 214 is electrically insulated from the outside.

Figure 12:
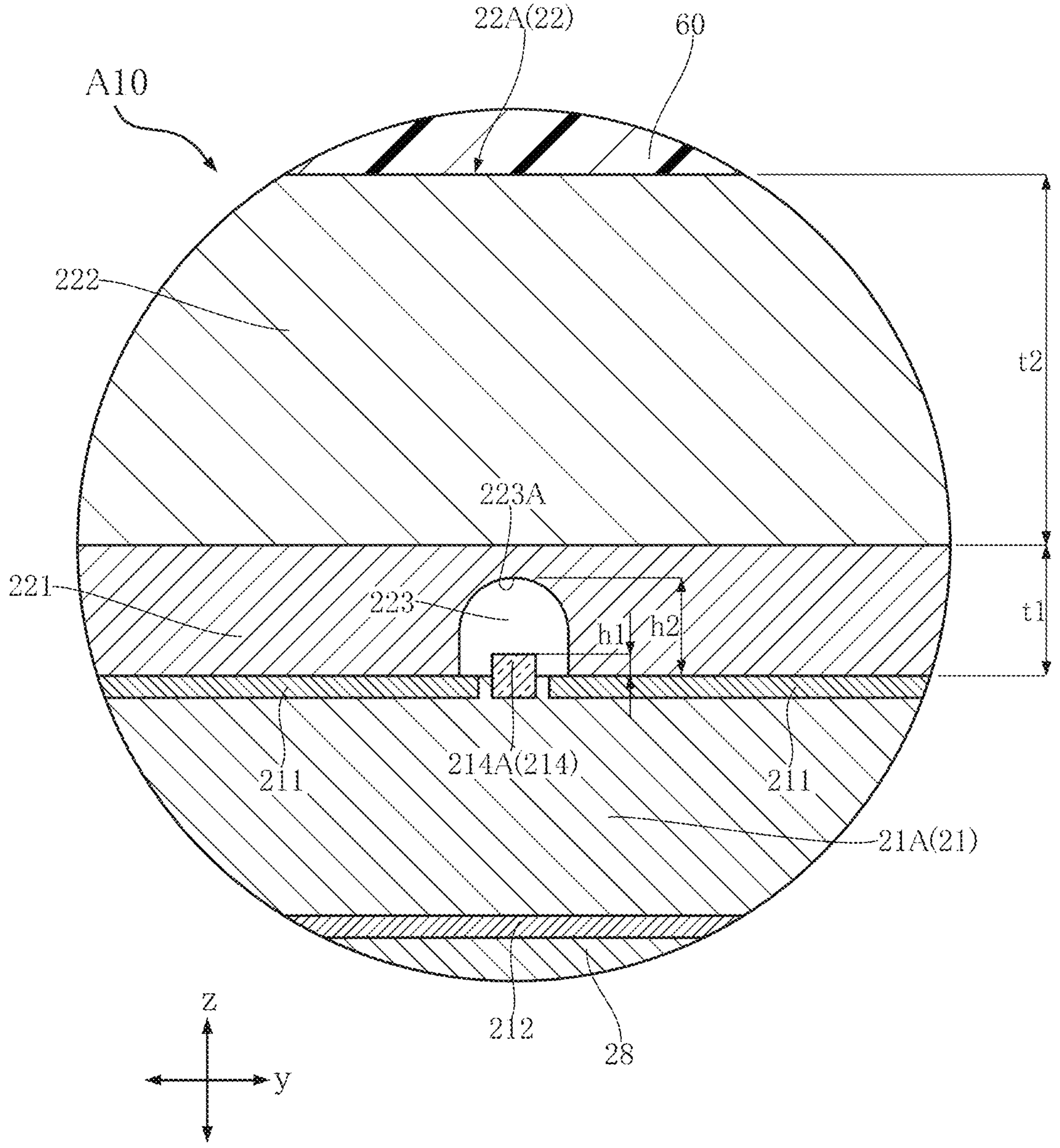
FIG. 12 is a cross-sectional view along line XII-XII in FIG. 10.

As shown in FIGS. 11 and 12, the gate finger 214 includes a protrusion 214A. The protrusion 214A protrudes beyond the first electrode 211 toward the buffer layer 22.

As shown in FIGS. 7, 8, and 11, the buffer layers 22 are electrically bonded the respective first electrodes 211 of the semiconductor elements 21. In the semiconductor device A10, the buffer layers 22 include four first buffer layers 22A and four second buffer layers 22B. The four first buffer layers 22A are electrically bonded to the respective first electrodes 211 of the four first elements 21A. The four buffer layers 22B are electrically bonded to the respective first electrodes 211 of the four second elements 21B. As shown in FIGS. 11 and 12, each of the buffer layers 22 has a first layer 221 and a second layer 222.

As shown in FIGS. 11 and 12, the first layer 221 faces the first electrode 211 of one of the semiconductor elements 21 in the first direction z. The composition of the first layer 221 includes aluminum (Al). The first layer 221 may be formed by stacking a thin metal film on the second layer 222 by sputtering, for example.

As shown in FIGS. 11 and 12, the second layer 222 is located opposite from one of the semiconductor elements 21 with respect to the first electrode 211 in the first direction z. The composition of the second layer 222 includes the same material (element) as the composition of the first conductive members 41 and the second conductive members 42. In the semiconductor device A10, the composition of the second layer 222 includes copper. Accordingly, the Vickers hardness of the first layer 221 is lower than the Vickers hardness of the second layer 222. Furthermore, a dimension t1 of the first layer 221 in the first direction z is smaller than a dimension t2 of the second layer 222 in the first direction z.

Figure 13:
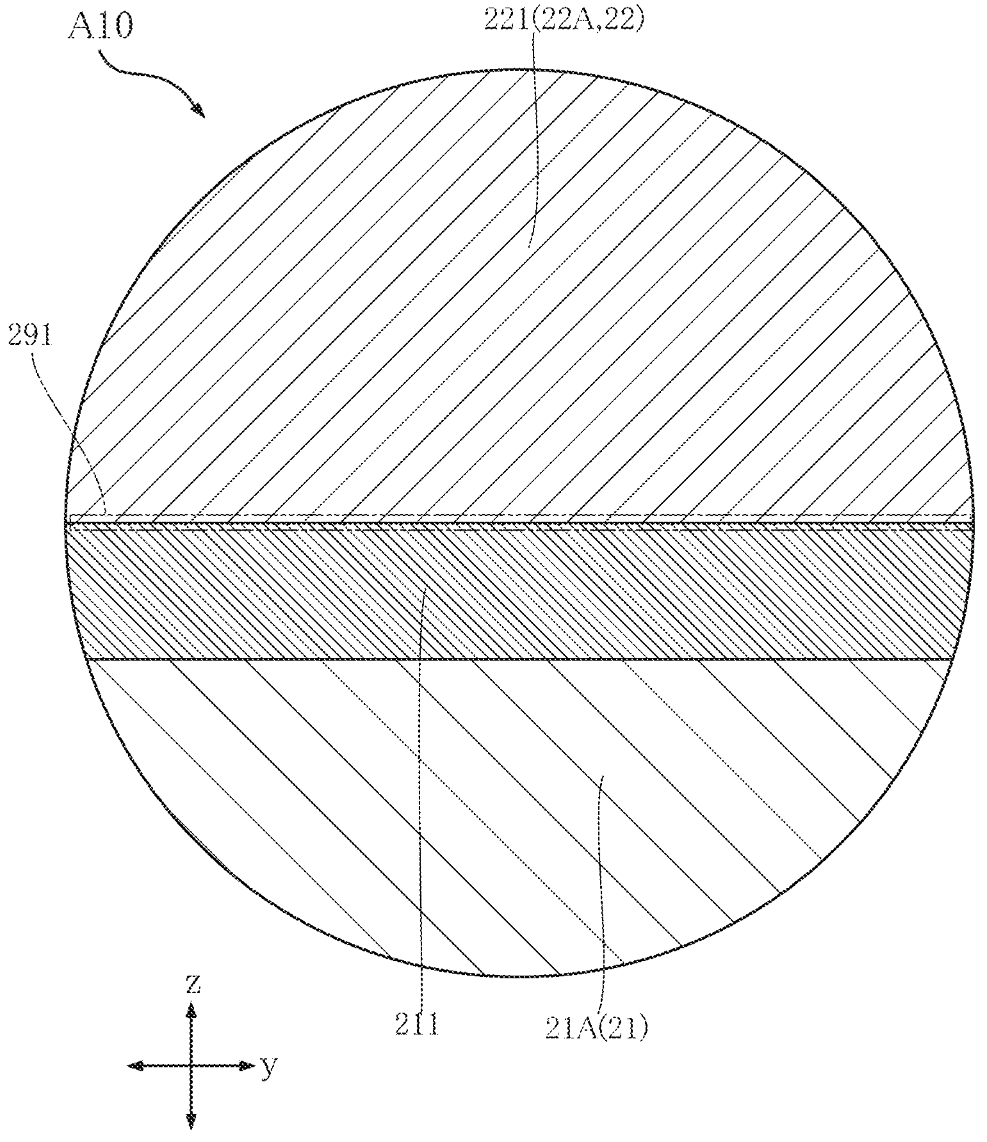
FIG. 13 is a partially enlarged view of FIG. 12.

The first layer 221 is electrically bonded to the first electrode 211 of one of the semiconductor elements 21 by solid phase diffusion. Accordingly, as shown in FIG. 13, a first solid phase diffusion binding layer 291 is located between the first electrode 211 of one of the semiconductor elements 21 and the buffer layer 22 electrically bonded to the first electrode 211. In the semiconductor device A10, the first solid phase diffusion binding layer 291 is located between the first electrode 211 and the first layer 221.

Note that a solid phase diffusion binding layer (any of the first solid phase diffusion binding layer 291, a below-described solid phase diffusion binding layer 292, and a below-described solid phase diffusion binding layer 293) refers to a metal binding layer located at the interface between two metal layers that are in contact with each other as a result of the two metal layers being bonded by solid phase diffusion. The solid phase diffusion binding layer does not necessarily exist as a metal binding layer having a significant thickness. The solid phase diffusion binding layer may be recognized as a portion along the interface between the two metal layers where impurities or voids introduced during the bonding by solid phase diffusion remain.

As shown in FIGS. 11 and 12, each of the buffer layers 22 is formed with a recess 223. The recess 223 is recessed from the side facing one of the semiconductor elements 21 in the first direction z. At least a part of the protrusion 214A of the gate finger 214 is accommodated in the recess 223.

As shown in FIG. 12, in the semiconductor device A10, the protrusion 214A of the gate finger 214 is spaced apart from the buffer layer 22. A dimension h1 of the protrusion 214A in the first direction z is smaller than a dimension h2 of the recess 223 in the first direction z. Furthermore, in the semiconductor device A10, the dimension t1 of the first layer 221 in the first direction z is larger than the dimension h2 of the recess 223 in the first direction z.

As shown in FIG. 12, the recess 223 has an intermediate surface 223A facing the protrusion 214A of the gate finger 214 in the first direction z. The intermediate surface 223A is recessed inward of the first layer 221. Alternatively, the intermediate surface 223A may be a flat surface parallel to one of the first obverse surface 121 of the first conductive layer 12A and the second obverse surface 122 of the second conductive layer 12B. The recess 223 may be formed by laser irradiation, for example.

As shown in FIG. 11, the bonding layer 28 is located between one of the two conductive layers 12 and the second electrode 212 of one of the semiconductor elements 21. The Vickers hardness of the bonding layer 28 is lower than the Vickers hardness of each of the two conductive layers 12. The composition of the bonding layer 28 includes aluminum. The second electrode 212 of each of the semiconductor elements 21 is electrically bonded to one of the two conductive layers 12 via the bonding layer 28. As a result, the second electrodes 212 of the four first elements 21A are electrically connected to the first conductive layer 12A. The second electrodes 212 of the four second elements 21B are electrically connected to the second conductive layer 12B.

Figure 14:
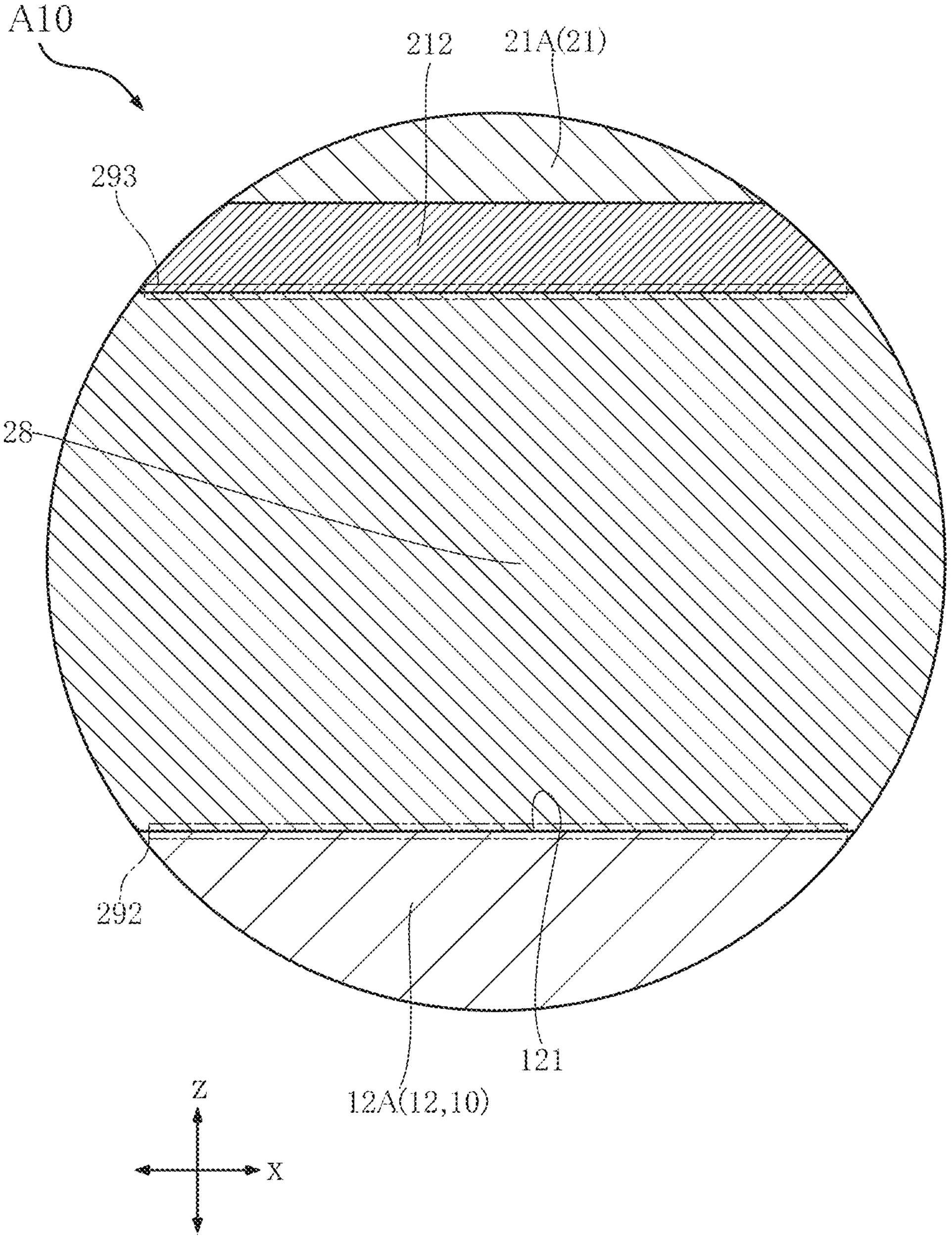
FIG. 14 is a partially enlarged view of FIG. 11.

The second electrode 212 of each of the semiconductor elements 21 is electrically bonded to one of the two conductive layers 12 via the bonding layer 28 by solid phase diffusion. Accordingly, as shown in FIG. 14, a second solid phase diffusion binding layer 292 is located between one of the two conductive layers 12 and the bonding layer 28. A third solid phase diffusion binding layer 293 is located between the bonding layer 28 and the second electrode 212 of one of the semiconductor elements 21. In the manufacturing process of the semiconductor device A10, the second solid phase diffusion binding layer 292 and the third solid phase diffusion binding layer 293 are formed simultaneously with the first solid phase diffusion binding layer 291 described above.

As shown in FIGS. 2, 3, and 7, the first gate wiring layer 141 is bonded to the insulating layer 11. The first gate wiring layer 141 is electrically connected to the gate electrodes 213 of the four first elements 21A. As viewed in the first direction z, the first gate wiring layer 141 is located in the cutout part of the first conductive layer 12A. The first gate wiring layer 141 extends in the third direction y. The composition of the first gate wiring layer 141 includes copper.

As shown in FIG. 3, a plurality of first wires 51 are each electrically bonded to the gate electrode 213 of one of the four first elements 21A and the first gate wiring layer 141. This electrically connects the gate electrodes 213 of the four first elements 21A to the first gate wiring layer 141. The composition of the first wires 51 includes gold (Au). Alternatively, the composition of the first wires 51 may include copper or aluminum.

Figure 5:
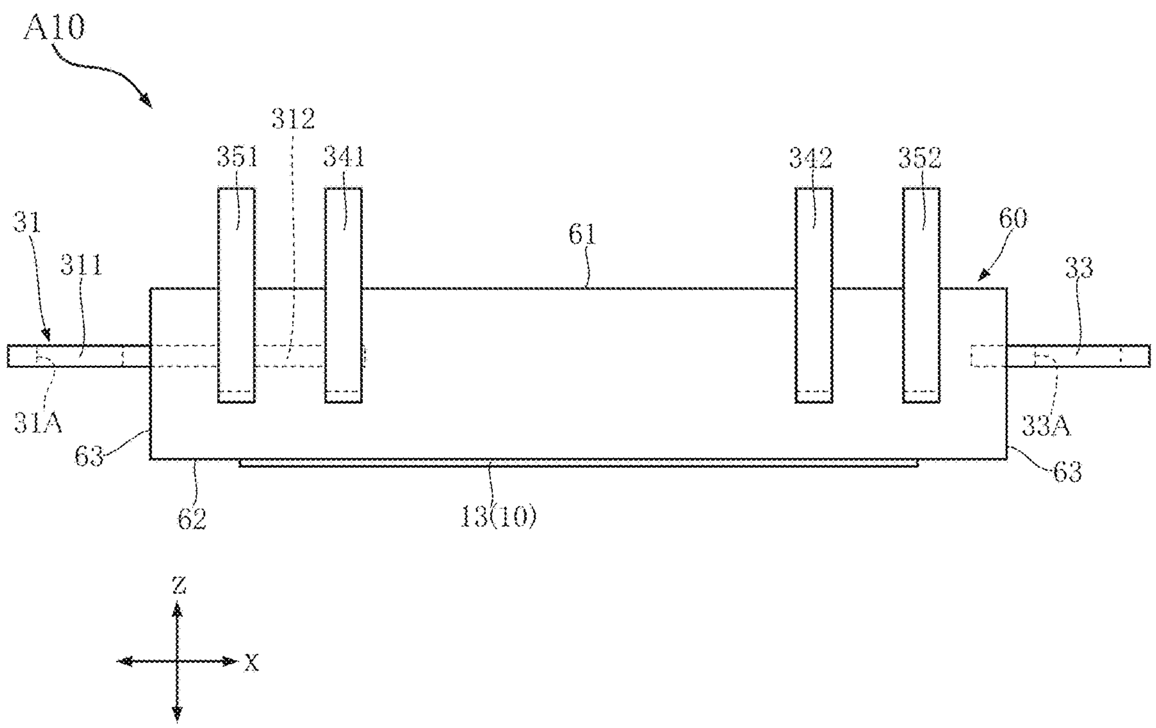
FIG. 5 is a front view showing the semiconductor device in FIG. 1.
Figure 6:
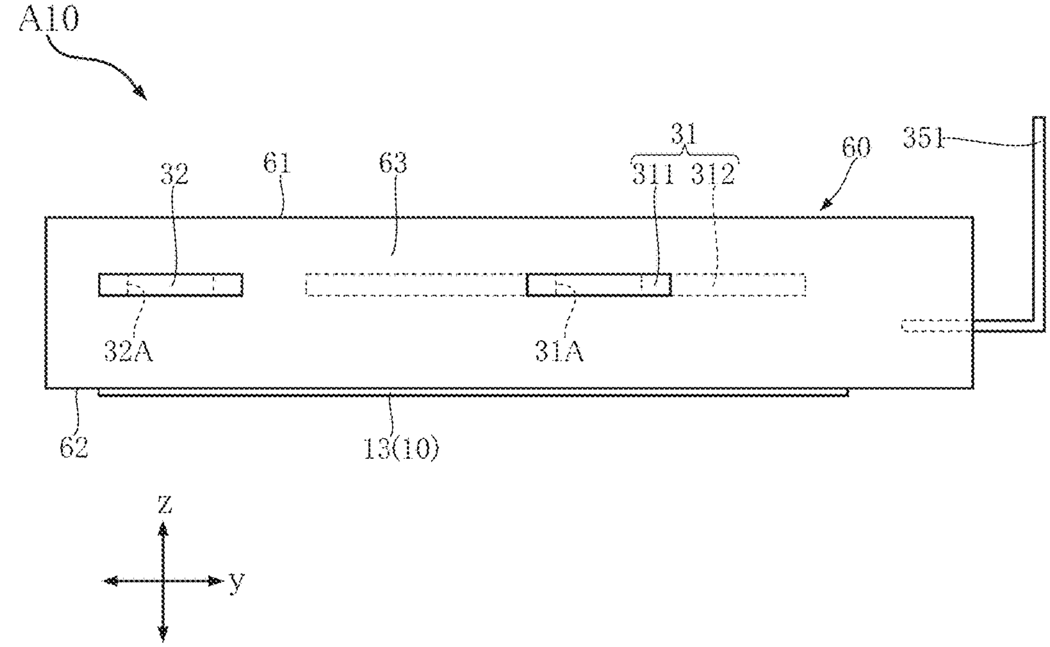
FIG. 6 is a left-side view showing the semiconductor device in FIG. 1.

As shown in FIGS. 2 and 3, the first gate terminal 341 is located on a first side in the third direction y with respect to the support member 10. The first gate terminal 341 is electrically connected to the first gate wiring layer 141. The first gate terminal 341 is a metal lead made of a material containing copper or a copper alloy. As shown in FIGS. 1 to 9, a part of the first gate terminal 341 is covered with the sealing resin 60. The first gate terminal 341 has an L shape as viewed in the second direction x. As shown in FIG. 5, the first gate terminal 341 includes a portion upright in the first direction z. The portion is exposed to the outside from the sealing resin 60. A gate voltage for driving the four first elements 21A is applied to the first gate terminal 341.

As shown in FIGS. 2, 3, and 7, the second gate wiring layer 142 is bonded to the insulating layer 11. The second gate wiring layer 142 is electrically connected to the gate electrodes 213 of the four second elements 21B. As viewed in the first direction z, the second gate wiring layer 142 is located in the cutout part of the second conductive layer 12B. The second gate wiring layer 142 extends in the third direction y. The composition of the second gate wiring layer 142 includes copper.

As shown in FIG. 3, a plurality of third wires 53 are each electrically bonded to the gate electrode 213 of one of the four second elements 21B and the second gate wiring layer 142. This electrically connects the gate electrodes 213 of the four second elements 21B to the second gate wiring layer 142. The composition of the third wires 53 includes gold. Alternatively, the composition of the third wires 53 may include copper or aluminum.

As shown in FIGS. 2 and 3, the second gate terminal 342 is located on the same side as the first gate terminal 341 with respect to the support member 10 in the third direction y. The second gate terminal 342 is electrically connected to the second gate wiring layer 142. The second gate terminal 342 is a metal lead made of a material containing copper or a copper alloy. As shown in FIG. 1, a part of the second gate terminal 342 is covered with the sealing resin 60. The second gate terminal 342 has an L shape as viewed in the second direction x. As shown in FIG. 5, the second gate terminal 342 includes a portion upright in the first direction z. The portion is exposed to the outside from the sealing resin 60. A gate voltage for driving the four second elements 21B is applied to the second gate terminal 342.

As shown in FIGS. 2 and 3, one fifth wire 55 is electrically bonded to the first gate terminal 341 and the first gate wiring layer 141, and another fifth wire 55 is electrically bonded to the second gate terminal 342 and the second gate wiring layer 142. As a result, the first gate terminal 341 is electrically connected to the first gate wiring layer 141. The second gate terminal 342 is electrically connected to the second gate wiring layer 142. The composition of the two fifth wires 55 includes gold. Alternatively, the composition of the two fifth wires 55 may include copper or aluminum.

As shown in FIGS. 2, 3, and 7, the first detection wiring layer 151 is bonded to the insulating layer 11. The first detection wiring layer 151 is electrically connected to the first electrodes 211 of the four first elements 21A. As viewed in the first direction z, the first detection wiring layer 151 is located in the cutout part of the first conductive layer 12A, and is adjacent to the first gate wiring layer 141 in the second direction x. The first detection wiring layer 151 extends in the third direction y. The composition of the first detection wiring layer 151 includes copper.

As shown in FIG. 3, a plurality of second wires 52 are each electrically bonded to the first electrode 211 of one of the four first elements 21A and the first detection wiring layer 151. This electrically connects the first electrodes 211 of the four first elements 21A to the first detection wiring layer 151. The composition of the second wires 52 includes gold. Alternatively, the composition of the second wires 52 may include copper or aluminum.

As shown in FIGS. 2 and 3, the first detection terminal 351 is located on the same side as the first gate terminal 341 with respect to the support member 10 in the third direction y, and is adjacent to the first gate terminal 341 in the second direction x. The first detection terminal 351 is electrically connected to the first detection wiring layer 151. The first detection terminal 351 is a metal lead made of a material containing copper or a copper alloy. As shown in FIG. 1, a part of the first detection terminal 351 is covered with the sealing resin 60. The first detection terminal 351 has an L shape as viewed in the second direction x. As shown in FIG. 5, the first detection terminal 351 includes a portion upright in the first direction z. The portion is exposed to the outside from the sealing resin 60. A voltage having a potential equal to the voltage applied to the first electrode 211 of each of the four first elements 21A is applied to the first detection terminal 351.

As shown in FIGS. 2, 3, and 7, the second detection wiring layer 152 is bonded to the insulating layer 11. The second detection wiring layer 152 is electrically connected to the first electrodes 211 of the four second elements 21B. As viewed in the first direction z, the second detection wiring layer 152 is located in the cutout part of the second conductive layer 12B, and is adjacent to the second gate wiring layer 142 in the second direction x. The second detection wiring layer 152 extends in the third direction y. The composition of the second detection wiring layer 152 includes copper.

As shown in FIG. 3, a plurality of fourth wires 54 are each electrically bonded to the first electrode 211 of one of the four second elements 21B and the second detection wiring layer 152. This electrically connects the first electrodes 211 of the four second elements 21B to the second detection wiring layer 152. The composition of the fourth wires 54 includes gold. Alternatively, the composition of the fourth wires 54 may include copper or aluminum.

As shown in FIGS. 2 and 3, the second detection terminal 352 is located on the same side as the second gate terminal 342 with respect to the support member 10 in the third direction y, and is adjacent to the second gate terminal 342 in the second direction x. The second detection terminal 352 is electrically connected to the second detection wiring layer 152. The second detection terminal 352 is a metal lead made of a material containing copper or a copper alloy. As shown in FIG. 1, a part of the second detection terminal 352 is covered with the sealing resin 60. The second detection terminal 352 has an L shape as viewed in the second direction x. As shown in FIG. 5, the second detection terminal 352 includes a portion upright in the first direction z. The portion is exposed to the outside from the sealing resin 60. A voltage having a potential equal to the voltage applied to the first electrode 211 of each of the four second elements 21B is applied to the second detection terminal 352.

As shown in FIGS. 2 and 3, one sixth wire 56 is electrically bonded to the first detection terminal 351 and the first detection wiring layer 151, and another sixth wire 56 is electrically bonded to the second detection terminal 352 and the second detection wiring layer 152. As a result, the first detection terminal 351 is electrically connected to the first detection wiring layer 151. The second detection terminal 352 is electrically connected to the second detection wiring layer 152. The composition of the two sixth wires 56 includes gold. Alternatively, the composition of the two sixth wires 56 may include copper or aluminum.

As shown in FIGS. 7 and 9, the first terminal 31 is spaced apart from the first conductive layer 12A to the side that the first obverse surface 121 of the first conductive layer 12A faces in the first direction z. The first terminal 31 is electrically connected to the first electrodes 211 of the four second elements 21B. The first terminal 31 is a metal plate made of a material containing copper or a copper alloy. As shown in FIG. 2, the first terminal 31 overlaps with the first conductive layer 12A as viewed in the first direction z.

As shown in FIGS. 1 to 7 (excluding FIG. 3), the first terminal 31 has a terminal portion 311 and a base portion 312. The terminal portion 311 is located away from the support member 10 as viewed in the first direction z. The terminal portion 311 is located on a first side in the second direction x with respect to the support member 10. A part of the terminal portion 311 is covered with the sealing resin 60. The terminal portion 311 is formed with a first mounting hole 31A penetrating through in the first direction z. The first mounting hole 31A is exposed to the outside from the sealing resin 60. The terminal portion 311 is an N terminal (negative electrode) to which the DC source voltage targeted for power conversion is applied.

FIGS. 1, 2, 4, and 7, the base portion 312 is connected to the terminal portion 311. As viewed in the first direction z, the base portion 312 overlaps with the insulating layer 11, the first conductive layer 12A, the first gate wiring layer 141, and the first detection wiring layer 151. The base portion 312 is located opposite from the second conductive layer 12B with respect to the four first elements 21A in the second direction x. As viewed in the first direction z, the base portion 312 has a rectangular shape elongated in the third direction y. The base portion 312 is covered with the sealing resin 60.

As shown in FIGS. 1 to 4, the second terminal 32 is spaced apart from the first terminal 31 in the third direction y. The second terminal 32 is located on the same side as the terminal portion 311 of the first terminal 31 with respect to the support member 10 in the second direction x. The second terminal 32 is electrically connected to the first conductive layer 12A. The second terminal 32 is a metal plate made of a material containing copper or a copper alloy. A part of the second terminal 32 is covered with the sealing resin 60. The second terminal 32 is formed with a second mounting hole 32A penetrating through in the first direction z. The second mounting hole 32A is exposed to the outside from the sealing resin 60. The second terminal 32 is a P terminal (positive electrode) to which the DC source voltage targeted for power conversion is applied.

As shown in FIGS. 2, 3, and 8, the third conductive member 43 is bonded to the second terminal 32 and the first obverse surface 121 of the first conductive layer 12A. As a result, the second terminal 32 is electrically connected to the first conductive layer 12A. Furthermore, in the semiconductor device A10, the second electrodes 212 of the four first elements 21A are electrically connected to the second terminal 32 via the first conductive layer 12A and the third conductive member 43. In the semiconductor device A10, the third conductive member 43 is a bonding wire. The composition of the third conductive member 43 includes either copper or aluminum. Alternatively, the third conductive member 43 may be a metal clip.

As shown in FIGS. 1 to 3, 7 and 8, the third terminal 33 is located opposite from the terminal portion 311 of the first terminal 31 and the second terminal 32 with respect to the support member 10 in the second direction x. The third terminal 33 is electrically connected to the second conductive layer 12B. The third terminal 33 is a metal plate made of a material containing copper or a copper alloy. A part of the third terminal 33 is covered with the sealing resin 60. The third terminal 33 is formed with a third mounting hole 33A penetrating through in the first direction z. The third mounting hole 33A is exposed to the outside from the sealing resin 60. The AC power resulting from the conversion by the semiconductor elements 21 is outputted from the third terminal 33.

As shown in FIGS. 2, 3, and 8, the fourth conductive member 44 is bonded to the third terminal 33 and the second obverse surface 122 of the second conductive layer 12B. As a result, the third terminal 33 is electrically connected to the second conductive layer 12B. Furthermore, in the semiconductor device A10, the second electrodes 212 of the four second elements 21B are electrically connected to the third terminal 33 via the second conductive layer 12B and the fourth conductive member 44. In the semiconductor device A10, the fourth conductive member 44 is a bonding wire. The composition of the fourth conductive member 44 includes either copper or aluminum. Alternatively, the fourth conductive member 44 may be a metal clip.

As shown in FIGS. 3, 7 and 8, each of the first conductive members 41 is electrically bonded to one of the four first buffer layers 22A and the second obverse surface 122 of the second conductive layer 12B. As shown in FIGS. 10 and 11, each of the first conductive members 41 is electrically bonded to the second layer 222 of one of the four first buffer layers 22A. This electrically connects the first electrodes 211 of the four first elements 21A to the second conductive layer 12B. As viewed in the first direction z, the first conductive members 41 extend in the second direction x. In the semiconductor device A10, the first conductive members 41 are bonding wires. The composition of the first conductive members 41 includes copper.

As shown in FIGS. 2 and 7, each of the second conductive members 42 is bonded to one of the four second buffer layers 22B and the first terminal 31. In the semiconductor device A10, the second conductive members 42 are bonded to the base portion 312 of the first terminal 31. Furthermore, each of the second conductive members 42 is electrically bonded to the second layer 222 of one of the four second buffer layers 22B. This electrically connects the first electrodes 211 of the four second elements 21B to the first terminal 31. As viewed in the first direction z, the second conductive members 42 overlap with the first conductive layer 12A. The semiconductor device A10 is such that, as viewed in the first direction z, each of the second conductive members 42 extends in the second direction x, and overlaps with one of the four first elements 21A and one of the first conductive members 41. In the semiconductor device A10, the second conductive members 42 are bonding wires. The composition of the second conductive members 42 includes copper.

As shown in FIGS. 1, and 7 to 9, the sealing resin 60 covers the insulating layer 11, the two conductive layers 12, the first gate wiring layer 141, the second gate wiring layer 142, the first detection wiring layer 151, the second detection wiring layer 152, the semiconductor elements 21, the buffer layers 22, the first conductive members 41, the second conductive members 42, the third conductive member 43, and the fourth conductive member 44. Furthermore, the sealing resin 60 covers a part of each of the heat dissipation layer 13, the first terminal 31, the second terminal 32, the third terminal 33, the first gate terminal 341, the second gate terminal 342, the first detection terminal 351, and the second detection terminal 352. The sealing resin 60 is electrically insulative. The sealing resin 60 is made of a material containing a black epoxy resin, for example.

As shown in FIGS. 5 to 8, the sealing resin 60 has a top surface 61, a bottom surface 62, and two side surfaces 63. The top surface 61 faces the same side as the first obverse surface 121 of the first conductive layer 12A in the first direction z. The bottom surface 62 faces away from the top surface 61 in the first direction z. The heat dissipation layer 13 is exposed to the outside from the bottom surface 62. A part of the heat dissipation layer 13 protrudes from the bottom surface 62 in the first direction z. The two side surfaces 63 are spaced apart from each other in the second direction x, and are connected to the top surface 61 and the bottom surface 62. The terminal portion 311 of the first terminal 31 and the second terminal 32 are exposed to the outside from one of the two side surfaces 63. The third terminal 33 is exposed to the outside from the other one of the two side surfaces 63.

Next, advantages of the semiconductor device A10 will be described.

The semiconductor device A10 includes a semiconductor element 21 having a first electrode 211 and a gate finger 214 and bonded to a support member 10, and a buffer layer 22 electrically bonded to the first electrode 211. A first solid phase diffusion binding layer 291 is located between the first electrode 211 and the buffer layer 22. The gate finger 214 includes a protrusion 214A protruding beyond the first electrode 211 toward the buffer layer 22. The buffer layer 22 is formed with a recess 223 recessed from the side facing the semiconductor element 21 in the first direction z. At least a part of the protrusion 214A is accommodated in the recess 223. This configuration alleviates the interference of the buffer layer 22 with the gate finger 214 when the buffer layer 22 is electrically bonded to the first electrode 211 by solid phase diffusion. As a result, an impact transmitted from the buffer layer 22 to the semiconductor element 21 via the gate finger 214 is reduced. Thus, the semiconductor device A10 is capable of reducing an impact on the semiconductor element 21 when the buffer layer 22 is electrically bonded to an electrode (the first electrode 211) of the semiconductor element 21 having the gate finger 214 by solid phase diffusion.

The buffer layer 22 has a first layer 221, and a second layer 222 located opposite from the semiconductor element 21 with respect to the first layer 221 in the first direction z. The Vickers hardness of the first layer 221 is lower than the Vickers hardness of the second layer 222. This configuration reduces the deflection occurring in each of the first electrode 211 and the second layer 222 in the first direction z when the buffer layer 22 is electrically bonded to the first electrode 211 by solid phase diffusion, thus strengthening the biding state of the first solid phase diffusion binding layer 291.

The dimension t1 of the first layer 221 in the first direction z is smaller than the dimension t2 of the second layer 222 in the first direction z. In this case, the composition of the first layer 221 includes aluminum, and the composition of the second layer 222 includes copper. This configuration reduces the thermal resistance of the buffer layer 22 in the first direction z, and increases the heat conducted in a direction perpendicular to the first direction z. This makes it possible to improve the heat dissipation of the buffer layer 22.

In the semiconductor device A10, the protrusion 214A of the gate finger 214 is spaced apart from the buffer layer 22. This configuration prevents the buffer layer 22 from coming into contact with the gate finger 214 when the buffer layer 22 is electrically bonded to the first electrode 211 by solid phase diffusion, thus alleviating the interference of the buffer layer 22 with the gate finger 214 more reliably.

The recess 223 formed in the buffer layer 22 has an intermediate surface 223A facing the protrusion 214A of the gate finger 214 in the first direction z. The intermediate surface 223A is recessed inward of the first layer 221. This configuration reduces the volume of the recess 223 when the dimension h2 of the recess 223 in the first direction z is fixed.

The composition of a first conductive member 41 and a second conductive member 42 includes copper. This configuration makes it possible to increase the current flowing through each of the first conductive member 41 and the second conductive member 42. In this case, the composition of the second layer 222 of the buffer layer 22 includes copper, which is the same element in the composition of each of the first conductive member 41 and the second conductive member 42, thereby improving the bonding strength of each of the first conductive member 41 and the second conductive member 42 with respect to the second layer 222.

As viewed in the first direction z, a first terminal 31 overlaps with a first conductive layer 12A. This configuration causes mutual inductance to be generated between the first conductive layer 12A and the first terminal 31, thereby reducing the parasitic inductance appearing in each of the first conductive layer 12A and the first terminal 31. This makes it possible to reduce the surge voltage to be applied to a first element 21A, and to suppress the power loss in the first conductive layer 12A.

As viewed in the first direction z, the second conductive member 42 overlaps with the first element 21A. This contributes to a reduction in the dimension of the semiconductor device A10 in the third direction y. Furthermore, as viewed in the first direction z, the second conductive member 42 overlaps with the first conductive member 41. This configuration causes mutual inductance to be generated between the first conductive member 41 and the second conductive member 42, thereby reducing the parasitic inductance appearing in each of the first conductive member 41 and the second conductive member 42. Thus, the power loss in the first conductive member 41 can be further suppressed.

The support member 10 includes a heat dissipation layer 13 located opposite from a conductive layer 12 with respect to an insulating layer 11 in the first direction z. The heat dissipation layer 13 is exposed to the outside from a bottom surface 62 of a sealing resin 60. This makes it possible to improve the heat dissipation of the semiconductor device A10.

As viewed in the first direction z, the conductive layer 12 and the heat dissipation layer 13 are surrounded by a periphery 111 of the insulating layer 11. With this configuration, the periphery 111 is sandwiched by the sealing resin 60 in the first direction z. This prevents the support member 10 from falling off the sealing resin 60.

The dimension of the conductive layer 12 is larger than the dimension of the insulating layer 11 in the first direction z. This configuration improves the heat conduction efficiency of the conductive layer 12 in a direction perpendicular to the first direction z. This contributes to an improvement of the heat dissipation of the semiconductor device A10.

Second Embodiment

Figure 15:
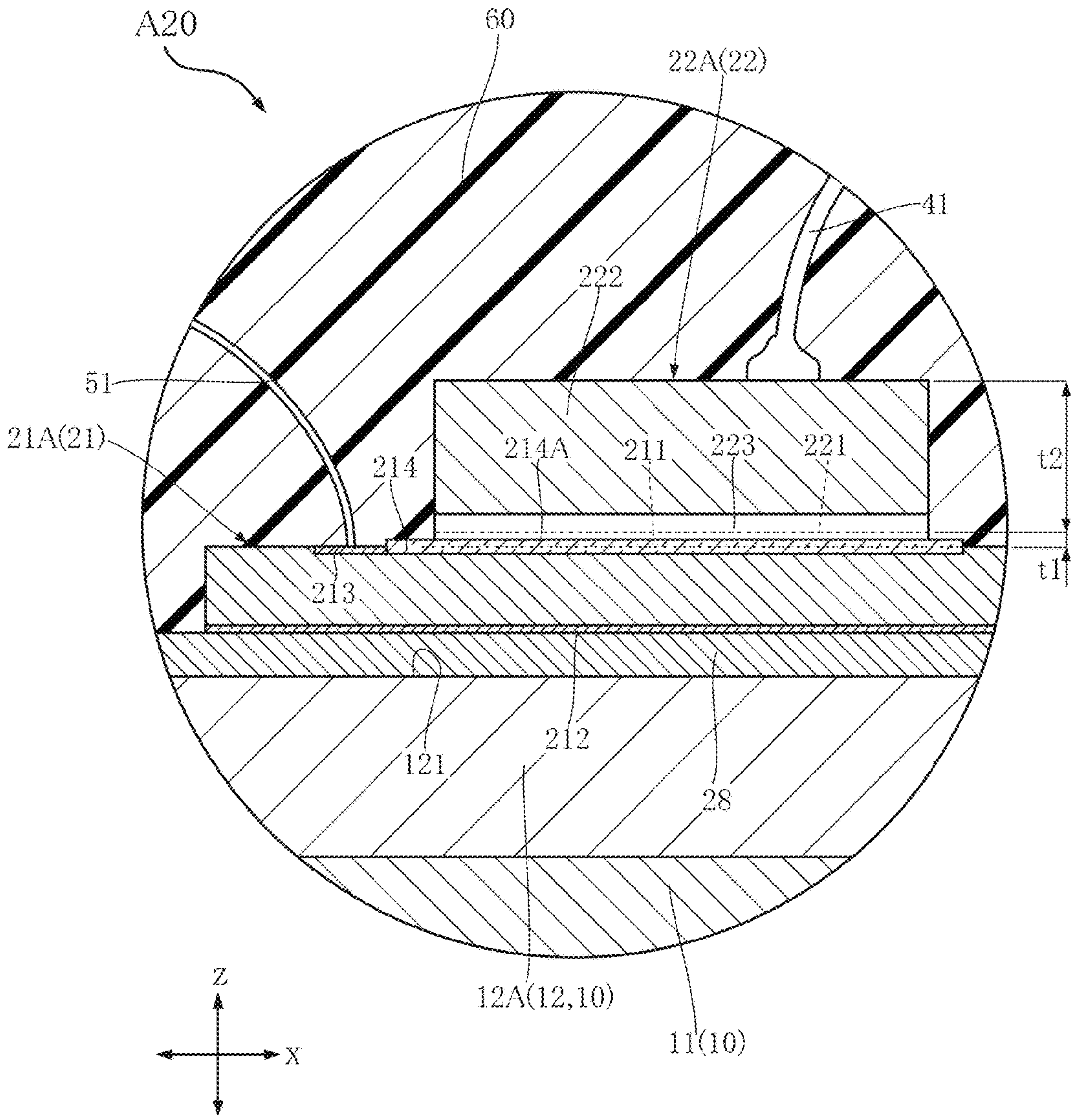
FIG. 15 is a partially enlarged cross-sectional view showing semiconductor device according to a second embodiment of the present disclosure.
Figure 16:
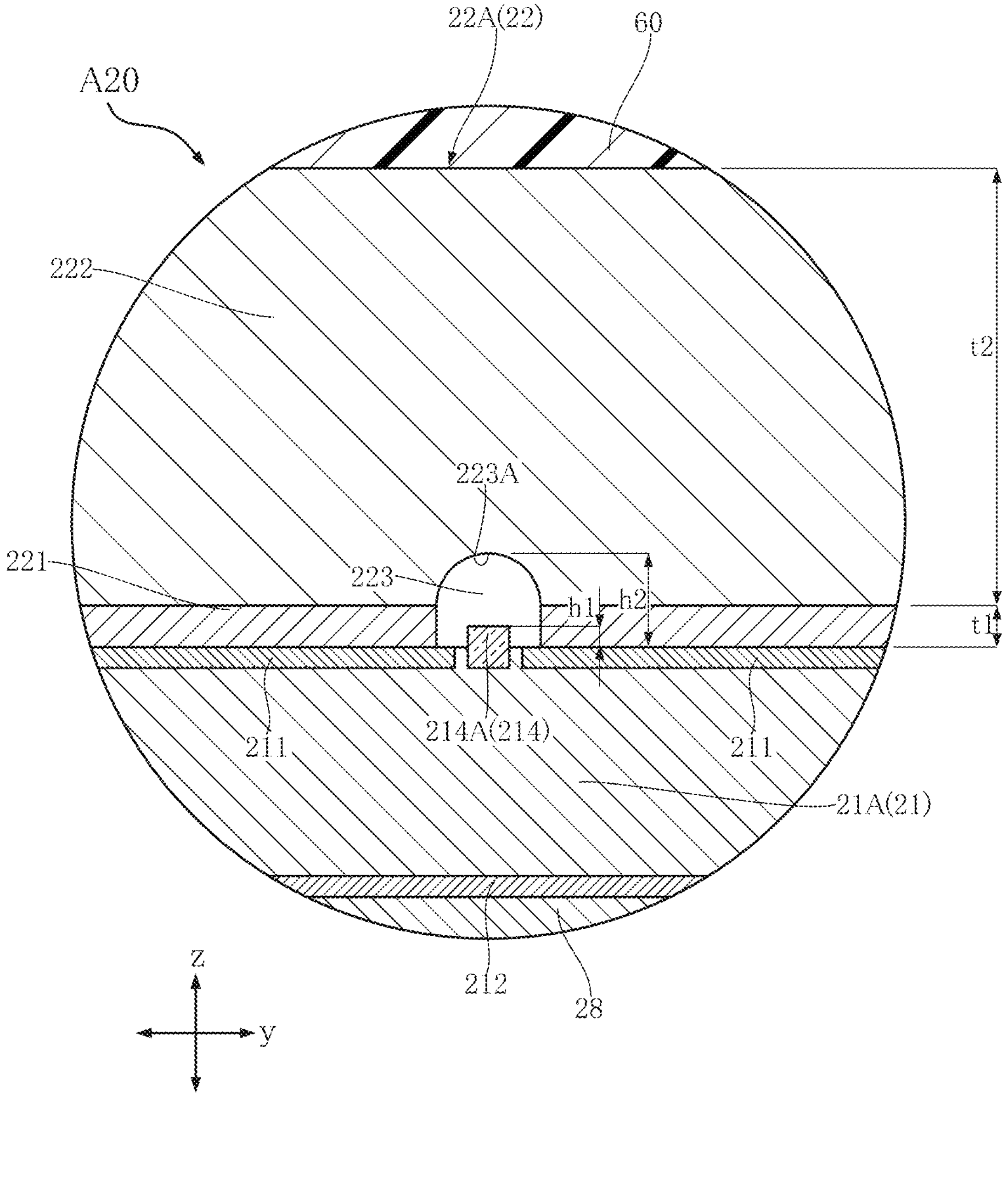
FIG. 16 is a partially enlarged cross-sectional view showing the semiconductor device in FIG. 15 but different from FIG. 15 in cross-sectional position.

The following describes a semiconductor device A20 according to a second embodiment of the present disclosure, with reference to FIGS. 15 and 16. In these figures, elements that are the same as or similar to those of the semiconductor device A10 described above are provided with the same reference numerals, and descriptions thereof are omitted. Note that the cross-section shown in FIG. 15 is taken along the same line as the cross-section of the semiconductor device A10 shown in FIG. 11. The cross-section shown in FIG. 16 is taken along the same line as the cross-section of the semiconductor device A10 shown in FIG. 12.

The semiconductor device A20 is different from the semiconductor device A10 in the configuration of the buffer layers 22.

As shown in FIGS. 15 and 16, the recess 223 in each of the buffer layers 22 passes through the first layer 221 in the first direction z, and is recessed into the second layer 222. Thus, in the semiconductor device A20, the dimension t1 of the first layer 221 in the first direction z is smaller than the dimension h2 of the recess 223 in the first direction z.

Next, advantages of the semiconductor device A20 will be described.

The semiconductor device A20 includes a semiconductor element 21 having a first electrode 211 and a gate finger 214 and bonded to a support member 10, and a buffer layer 22 electrically bonded to the first electrode 211. A first solid phase diffusion binding layer 291 is located between the first electrode 211 and the buffer layer 22. The gate finger 214 includes a protrusion 214A protruding beyond the first electrode 211 toward the buffer layer 22. The buffer layer 22 is formed with a recess 223 recessed from the side facing the semiconductor element 21 in the first direction z. At least a part of the protrusion 214A is accommodated in the recess 223. Thus, the semiconductor device A20 is also capable of reducing an impact on the semiconductor element 21 when the buffer layer 22 is electrically bonded to an electrode (the first electrode 211) of the semiconductor element 21 having the gate finger 214 by solid phase diffusion. Furthermore, the semiconductor device A20 has configurations similar to the semiconductor device A10, whereby the semiconductor device A20 also has advantages owing to the configurations.

In the semiconductor device A20, the dimension t1 of a first layer 221 of the buffer layer 22 is smaller than the dimension h2 of the recess 223 formed in the buffer layer 22 in the first direction z. This configuration makes it possible to set the dimension t1 of the first layer 221 in the first direction z as small as possible and the dimension t2 of a second layer 222 in the first direction z as large as possible, while improving the biding state of the first solid phase diffusion binding layer 291 located between the first electrode 211 and the buffer layer 22. As such, when the composition of the first layer 221 includes aluminum and the composition of the second layer 222 includes copper, the thermal resistance of the buffer layer 22 in the first direction z is further reduced, and the heat conducted in a direction perpendicular to the first direction z is further increased. This makes it possible to further improve the heat dissipation of the buffer layer 22.

Third Embodiment

Figure 17:
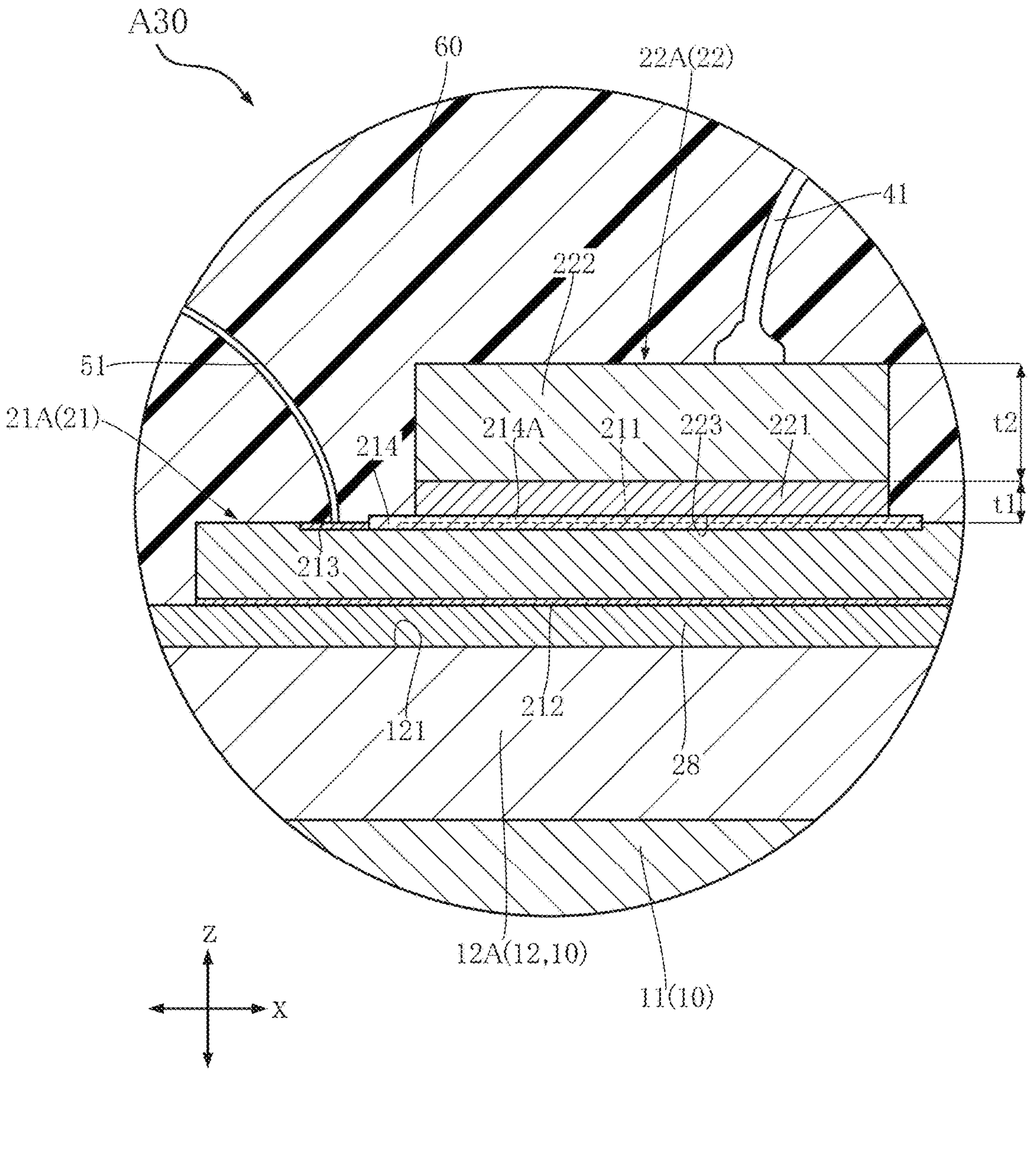
FIG. 17 is a partially enlarged cross-sectional view showing a semiconductor device according to a third embodiment of the present disclosure.
Figure 18:
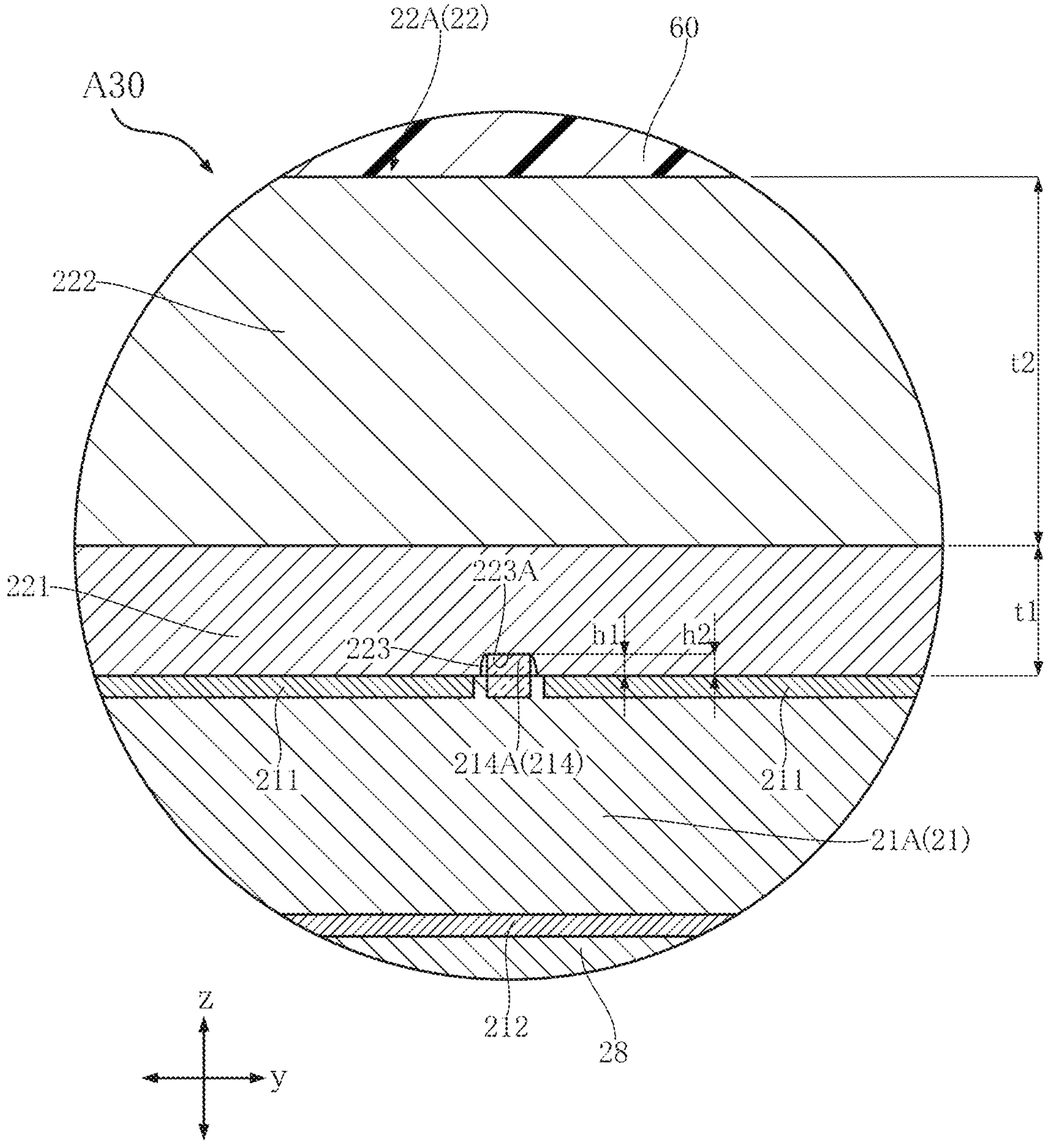
FIG. 18 is a partially enlarged cross-sectional view showing the semiconductor device in FIG. 17 but different from FIG. 17 in cross-sectional position.

The following describes a semiconductor device A30 according to a third embodiment of the present disclosure, with reference to FIGS. 17 and 18. In these figures, elements that are the same as or similar to those of the semiconductor device A10 described above are provided with the same reference numerals, and descriptions thereof are omitted. Note that the cross-section shown in FIG. 17 is taken along the same line as the cross-section of the semiconductor device A10 shown in FIG. 11. The cross-section shown in FIG. 18 is taken along the same line as the cross-section of the semiconductor device A10 shown in FIG. 12.

The semiconductor device A30 is different from the semiconductor device A10 in the configuration of the buffer layers 22.

As shown in FIGS. 17 and 18, the protrusion 214A of the gate finger 214 of each semiconductor element 21 is in contact with the first layer 221 of one of the buffer layers 22. The Vickers hardness of the first layer 221 is lower than the Vickers hardness of the protrusion 214A.

Next, advantages of the semiconductor device A30 will be described.

The semiconductor device A30 includes a semiconductor element 21 having a first electrode 211 and a gate finger 214 and bonded to a support member 10, and a buffer layer 22 electrically bonded to the first electrode 211. A first solid phase diffusion binding layer 291 is located between the first electrode 211 and the buffer layer 22. The gate finger 214 includes a protrusion 214A protruding beyond the first electrode 211 toward the buffer layer 22. The buffer layer 22 is formed with a recess 223 recessed from the side facing the semiconductor element 21 in the first direction z. At least a part of the protrusion 214A is accommodated in the recess 223. Thus, the semiconductor device A30 is also capable of reducing an impact on the semiconductor element 21 when the buffer layer 22 is electrically bonded to an electrode (the first electrode 211) of the semiconductor element 21 having the gate finger 214 by solid phase diffusion. Furthermore, the semiconductor device A30 has configurations similar to the semiconductor device A10, whereby the semiconductor device A30 also has advantages owing to the configurations.

In the semiconductor device A30, the protrusion 214A of the gate finger 214 is in contact with a first layer 221 of the buffer layer 22. In this case, the Vickers hardness of the first layer 221 is lower than the Vickers hardness of the protrusion 214A. With this configuration, the protrusion 214A fits into the first layer 221 when the buffer layer 22 is electrically bonded to the first electrode 211 by solid phase diffusion. This allows the semiconductor device A30 to alleviate the interference of the buffer layer 22 with the gate finger 214.

Fourth Embodiment

Figure 19:
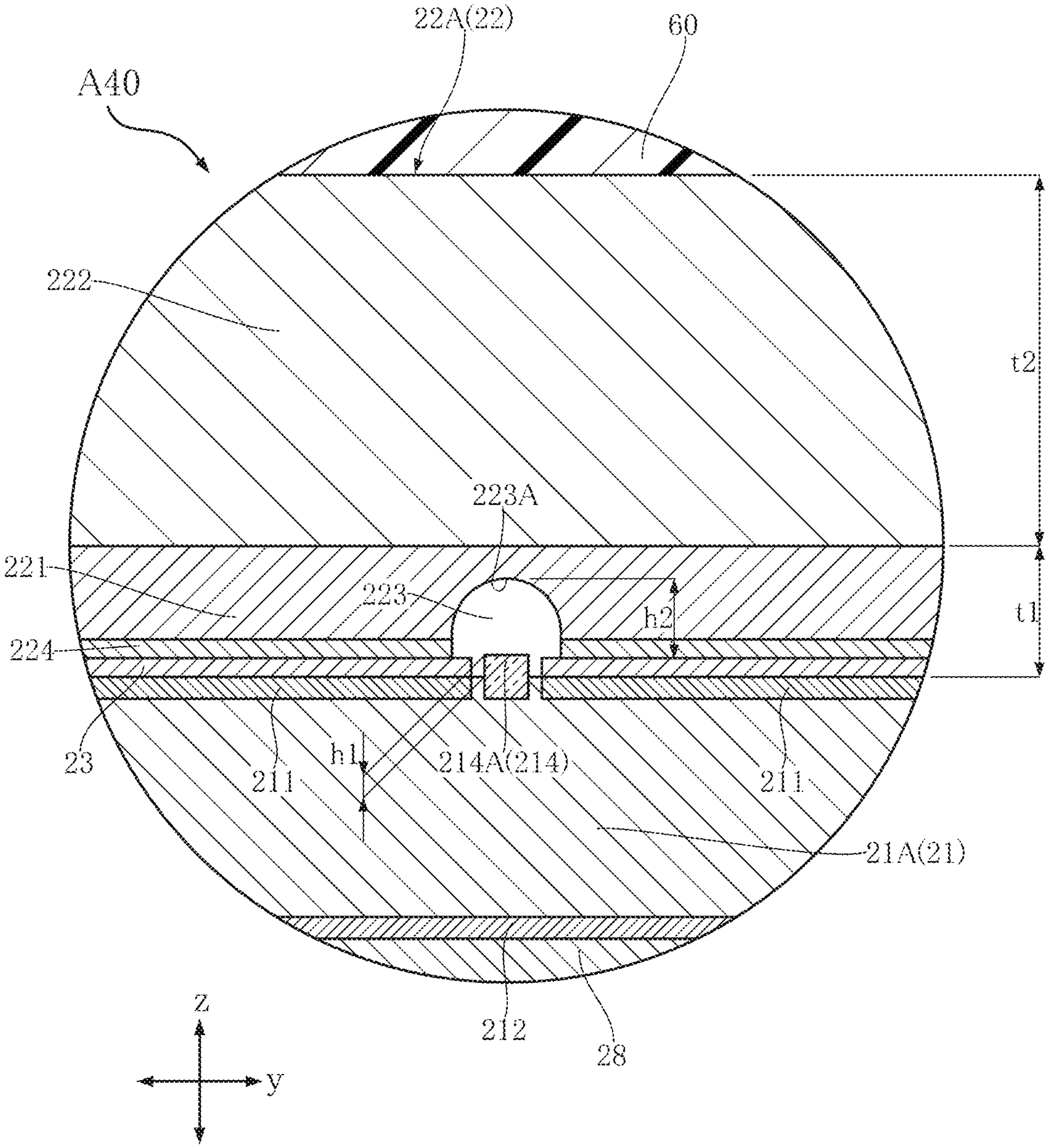
FIG. 19 is a partially enlarged cross-sectional view showing a semiconductor device according to a fourth embodiment of the present disclosure.
Figure 20:
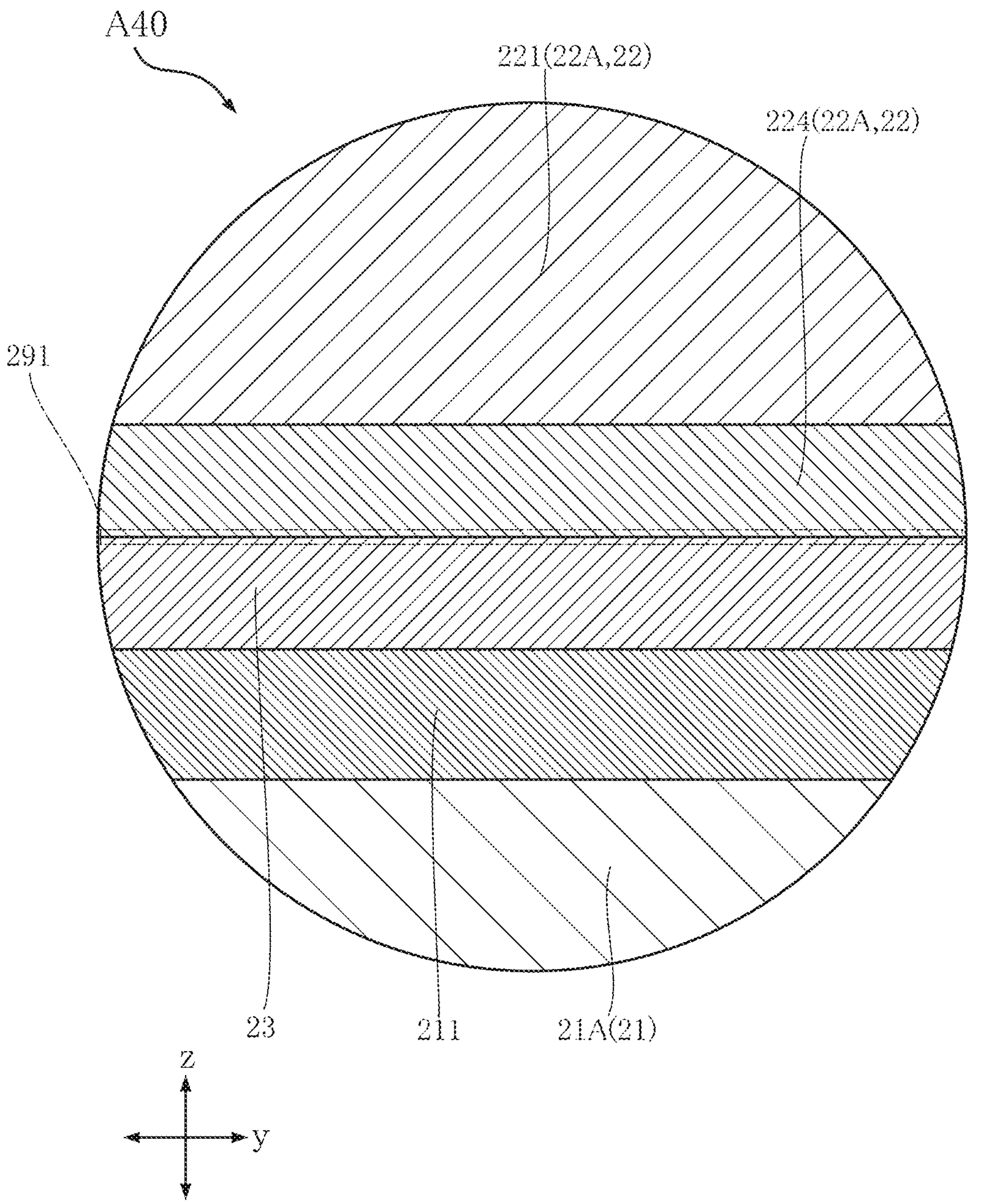
FIG. 20 is a partially enlarged view of FIG. 19.

The following describes a semiconductor device A40 according to a fourth embodiment of the present disclosure, with reference to FIGS. 19 and 20. In these figures, elements that are the same as or similar to those of the semiconductor device A10 described above are provided with the same reference numerals, and descriptions thereof are omitted. Note that the cross-section shown in FIG. 19 is taken along the same line as the cross-section of the semiconductor device A10 shown in FIG. 12.

The semiconductor device A40 is different from the semiconductor device A10 in the configuration of the buffer layers 22 and further including an intermediate layer 23.

As shown in FIG. 19, each of the buffer layers 22 has a third layer 224. The third layer 224 is located opposite from the second layer 222 with respect to the first layer 221. The recess 223 passes through the third layer 224 in the first direction z. The Vickers hardness of the third layer 224 is higher than the Vickers hardness of the first layer 221 and lower than the Vickers hardness of the second layer 222. The composition of the third layer 224 includes silver (Ag). The third layer 224 may be formed by stacking a thin metal film on the first layer 221 by sputtering, for example.

As shown in FIG. 19, the intermediate layer 23 is located between the first electrode 211 of one of the semiconductor elements 21 and the third layer 224 of one of the buffer layers 22. The Vickers hardness of the intermediate layer 23 is higher than the Vickers hardness of the first layer 221 and lower than the Vickers hardness of the second layer 222. The composition of the intermediate layer 23 includes silver. The intermediate layer 23 may be formed by depositing a metal layer on the first electrode 211 by electrolytic plating.

As shown in FIG. 20, in the semiconductor device A40, the first solid phase diffusion binding layer 291 is located between the intermediate layer 23 and the third layer 224 of one of the buffer layers 22.

Next, advantages of the semiconductor device A40 will be described.

The semiconductor device A40 includes a semiconductor element 21 having a first electrode 211 and a gate finger 214 and bonded to a support member 10, and a buffer layer 22 electrically bonded to the first electrode 211. A first solid phase diffusion binding layer 291 is located between the first electrode 211 and the buffer layer 22. The gate finger 214 includes a protrusion 214A protruding beyond the first electrode 211 toward the buffer layer 22. The buffer layer 22 is formed with a recess 223 recessed from the side facing the semiconductor element 21 in the first direction z. At least a part of the protrusion 214A is accommodated in the recess 223. Thus, the semiconductor device A40 is also capable of reducing an impact on the semiconductor element 21 when the buffer layer 22 is electrically bonded to an electrode (the first electrode 211) of the semiconductor element 21 having the gate finger 214 by solid phase diffusion. Furthermore, the semiconductor device A40 has configurations similar to the semiconductor device A10, whereby the semiconductor device A40 also has advantages owing to the configurations.

In the semiconductor device A40, the buffer layer 22 has a third layer 224 located opposite from a second layer 222 with respect to a first layer 221. The semiconductor device A40 further includes an intermediate layer 23 located between the first electrode 211 of the semiconductor element 21 and the third layer 224. The Vickers hardness of each of the third layer 224 and the intermediate layer 23 is higher than the Vickers hardness of the first layer 221 and lower than the Vickers hardness of the second layer 222. In this case, the first solid phase diffusion binding layer 291 is located between the intermediate layer 23 and the third layer 224. This configuration further strengthens the biding state of the first solid phase diffusion binding layer 291. Furthermore, a dimension t1 of the first layer 221 in the first direction z can be set even smaller.

The present disclosure is not limited to the embodiments described above. Various design changes can be made to the specific configurations of the elements of the present disclosure.

The present disclosure includes the embodiments described in the following clauses.

Clause 1.

A semiconductor device comprising:

a support member;

a semiconductor element including a first electrode and a gate electrode that are located opposite from a side facing the support member in a first direction, the semiconductor element being bonded to the support member;

a buffer layer electrically bonded to the first electrode; and a conductive member electrically bonded to the buffer layer, wherein a first solid phase diffusion binding layer is located between the first electrode and the buffer layer, the semiconductor element includes a gate finger located on a same side as the gate electrode in the first direction and connected to the gate electrode, the gate finger includes a protrusion protruding beyond the first electrode toward the buffer layer, the buffer layer is formed with a recess recessed from a side facing the semiconductor element in the first direction, and at least a part of the protrusion is accommodated in the recess.

Clause 2.

The semiconductor device according to clause 1, wherein the buffer layer includes a first layer and a second layer located opposite from the semiconductor element with respect to the first layer in the first direction, the conductive member is electrically bonded to the second layer, and a Vickers hardness of the first layer is lower than a Vickers hardness of the second layer.

Clause 3.

The semiconductor device according to clause 2, wherein a dimension of the first layer in the first direction is smaller than a dimension of the second layer in the first direction.

Clause 4.

The semiconductor device according to clause 2 or 3, wherein a composition of the second layer includes a same material as a composition of the conductive member.

Clause 5.

The semiconductor device according to clause 4, wherein the composition of each of the second layer and the conductive member includes copper.

Clause 6.

The semiconductor device according to clause 4 or 5, wherein the conductive member comprises a bonding wire.

Clause 7.

The semiconductor device according to any of clauses 4 to 6, wherein a composition of the first layer includes aluminum.

Clause 8.

The semiconductor device according to any of clauses 2 to 7, further comprising an intermediate layer, wherein the buffer layer includes a third layer located opposite from the second layer with respect to the first layer, the intermediate layer is located between the first electrode and the third layer, and a Vickers hardness of each of the third layer and the intermediate layer is higher than the Vickers hardness of the first layer and lower than the Vickers hardness of the second layer.

Clause 9.

The semiconductor device according to clause 8, wherein the first solid phase diffusion binding layer is located between the intermediate layer and the third layer.

Clause 10.

The semiconductor device according to any of clauses 2 to 9, wherein the protrusion is in contact with the first layer, and the Vickers hardness of the first layer is lower than a Vickers hardness of the protrusion.

Clause 11.

The semiconductor device according to any of clauses 2 to 9, wherein the protrusion is spaced apart from the buffer layer.

Clause 12.

The semiconductor device according to clause 11, wherein the dimension of the first layer in the first direction is larger than a dimension of the recess in the first direction.

Clause 13.

The semiconductor device according to clause 11, wherein the dimension of the first layer in the first direction is smaller than a dimension of the recess in the first direction.

Clause 14.

The semiconductor device according to clause 12 or 13, wherein the recess has an intermediate surface facing the protrusion in the first direction, and the intermediate surface is recessed inward of the first layer.

Clause 15.

The semiconductor device according to any of clauses 1 to 14, wherein the support member includes an insulating layer, and a conductive layer located between the insulating layer and the semiconductor element, the semiconductor element includes a second electrode facing the conductive layer in the first direction, and the second electrode is electrically bonded to the conductive layer.

Clause 16.

The semiconductor device according to clause 15, further comprising a bonding layer located between the conductive layer and the semiconductor element, wherein a Vickers hardness of the bonding layer is lower than a Vickers hardness of the conductive layer, a second solid phase diffusion binding layer is located between the conductive layer and the bonding layer, and a third solid phase diffusion binding layer is located between the bonding layer and the second electrode.

Clause 17.

The semiconductor device according to clause 15 or 16, wherein the support member includes a heat dissipation layer located opposite from the conductive layer with respect to the insulating layer in the first direction, and the conductive layer and the heat dissipation layer are surrounded by a periphery of the insulating layer as viewed in the first direction.

| REFERENCE NUMERALS | |
|---|---|
| A10, A20, A30, A40: Semiconductor device | |
| 10: Support member | 11: Insulating layer |
| 111: Periphery | 12: Conductive layer |
| 12A: First conductive layer | 12B: Second conductive layer |
| 121: First obverse surface | 122: Second obverse surface |
| 13: Heat dissipation layer | 141: First gate wiring layer |
| 142: Second gate wiring layer | |
| 151: First detection wiring layer | |
| 152: Second detection wiring layer | 21: Semiconductor element |
| 21A: First element | 21B: Second element |
| 211: First electrode | 212: Second electrode |
| 213: Gate electrode | 214: Gate finger |
| 214A: Protrusion | 22: Buffer layer |
| 22A: First buffer layer | 22B: Second buffer layer |
| 221: First layer | 222: Second layer |
| 223: Recess | 223A: Intermediate surface |
| 224: Third layer | 23: Intermediate layer |
| 28: Bonding layer | |
| 291: First solid phase diffusion binding layer | |
| 292: Second solid phase diffusion binding layer | |
| 293: Third solid phase diffusion binding layer | |
| 31: First terminal | 31A: First mounting hole |
| 311: Terminal portion | 312: Base portion |
| 313: Extending portion | 313A: Tip |
| 32: Second terminal | 32A: Second mounting hole |
| 33: Third terminal | 33A: Third mounting hole |
| 341: First gate terminal | 342: Second gate terminal |
| 351: First detection terminal | 352: Second detection terminal |
| 41: First conductive member | 42: Second conductive member |
| 43: Third conductive member | 44: Fourth conductive member |
| 51: First wire | 52: Second wire |
| 53: Third wire | 54: Fourth wire |
| 55: Fifth wire | 56: Sixth wire |

-continued

| REFERENCE NUMERALS | |
|---|---|
| 60: Sealing resin | 61: Top surface |
| 62: Bottom surface | 63: Side surface |
| z: First direction | x: Second direction y: Third direction |

The invention claimed is:

1. A semiconductor device comprising:

a support member;

a semiconductor element including a first electrode and a gate electrode that are located opposite from a side facing the support member in a first direction, the semiconductor element being bonded to the support member;

a buffer layer electrically bonded to the first electrode; and a conductive member electrically bonded to the buffer layer, wherein a first solid phase diffusion binding layer is located between the first electrode and the buffer layer, the semiconductor element includes a gate finger located on a same side as the gate electrode in the first direction and connected to the gate electrode, the gate finger includes a protrusion protruding beyond the first electrode toward the buffer layer, the buffer layer is formed with a recess recessed from a side facing the semiconductor element in the first direction, and at least a part of the protrusion is accommodated in the recess.

2. The semiconductor device according to claim 1, wherein the buffer layer includes a first layer and a second layer located opposite from the semiconductor element with respect to the first layer in the first direction, the conductive member is electrically bonded to the second layer, and a Vickers hardness of the first layer is lower than a Vickers hardness of the second layer.

3. The semiconductor device according to claim 2, wherein a dimension of the first layer in the first direction is smaller than a dimension of the second layer in the first direction.

4. The semiconductor device according to claim 2, wherein a composition of the second layer includes a same material as a composition of the conductive member.

5. The semiconductor device according to claim 4, wherein the composition of each of the second layer and the conductive member includes copper.

6. The semiconductor device according to claim 4, wherein the conductive member comprises a bonding wire.

7. The semiconductor device according to claim 4, wherein a composition of the first layer includes aluminum.

8. The semiconductor device according to claim 2, further comprising an intermediate layer, wherein the buffer layer includes a third layer located opposite from the second layer with respect to the first layer, the intermediate layer is located between the first electrode and the third layer, and a Vickers hardness of each of the third layer and the intermediate layer is higher than the Vickers hardness of the first layer and lower than the Vickers hardness of the second layer.

9. The semiconductor device according to claim 8, wherein the first solid phase diffusion binding layer is located between the intermediate layer and the third layer.

10. The semiconductor device according to claim 2, wherein the protrusion is in contact with the first layer, and the Vickers hardness of the first layer is lower than a Vickers hardness of the protrusion.

11. The semiconductor device according to claim 2, wherein the protrusion is spaced apart from the buffer layer.

12. The semiconductor device according to claim 11, wherein the dimension of the first layer in the first direction is larger than a dimension of the recess in the first direction.

13. The semiconductor device according to claim 11, wherein the dimension of the first layer in the first direction is smaller than a dimension of the recess in the first direction.

14. The semiconductor device according to claim 12, wherein the recess has an intermediate surface facing the protrusion in the first direction, and the intermediate surface is recessed inward of the first layer.

15. The semiconductor device according to claim 1, wherein the support member includes an insulating layer, and a conductive layer located between the insulating layer and the semiconductor element, the semiconductor element includes a second electrode facing the conductive layer in the first direction, and the second electrode is electrically bonded to the conductive layer.

16. The semiconductor device according to claim 15, further comprising a bonding layer located between the conductive layer and the semiconductor element, wherein a Vickers hardness of the bonding layer is lower than a Vickers hardness of the conductive layer, a second solid phase diffusion binding layer is located between the conductive layer and the bonding layer, and a third solid phase diffusion binding layer is located between the bonding layer and the second electrode.

17. The semiconductor device according to claim 15, wherein the support member includes a heat dissipation layer located opposite from the conductive layer with respect to the insulating layer in the first direction, and the conductive layer and the heat dissipation layer are surrounded by a periphery of the insulating layer as viewed in the first direction.

* * * * *